(12) United States Patent
Lotfi et al.

(10) Patent No.: US 10,989,390 B2
(45) Date of Patent: Apr. 27, 2021

(54) FOLDED OPTICS METHODS AND APPARATUS FOR IMPROVING EFFICIENCY OF LED-BASED LUMINAIRES

(71) Applicant: DMF, Inc., Carson, CA (US)

(72) Inventors: Amir Lotfi, Redondo Beach, CA (US); Benjamin Pin-Chun Chen, Lomita, CA (US); David Kessler, New York, NY (US)

(73) Assignee: DMF, Inc., Carson, CA (US)

( * ) Notice: Subject to any disclaimer, the term of this patent is extended or adjusted under 35 U.S.C. 154(b) by 0 days.

(21) Appl. No.: 16/831,322

(22) Filed: Mar. 26, 2020

(65) Prior Publication Data
US 2020/0232624 A1 Jul. 23, 2020

Related U.S. Application Data

(63) Continuation of application No. PCT/US2018/052996, filed on Sep. 26, 2018.
(Continued)

(51) Int. Cl.
*F21V 7/04* (2006.01)
*G02B 1/14* (2015.01)
(Continued)

(52) U.S. Cl.
CPC .............. *F21V 7/041* (2013.01); *F21V 5/005* (2013.01); *F21V 5/045* (2013.01); *F21V 7/0091* (2013.01);
(Continued)

(58) Field of Classification Search
CPC .......... F21V 7/041; F21V 7/28; F21V 7/0091; F21V 5/005; F21V 5/045; G02B 1/14; G02B 3/04; G02B 19/0028; F21Y 2115/10
See application file for complete search history.

(56) References Cited

U.S. PATENT DOCUMENTS

| 4,120,565 A | 10/1978 | Rabl et al. |
| 6,520,643 B1 | 2/2003 | Holman et al. |

(Continued)

FOREIGN PATENT DOCUMENTS

| CN | 1726410 A | 1/2006 |
| CN | 101988640 A | 3/2011 |

(Continued)

OTHER PUBLICATIONS

International Search Report and Written Opinion in International Patent Application No. PCT/US2018/052996 dated Mar. 4, 2019, 15 pages.
(Continued)

*Primary Examiner* — Mary Ellen Bowman
(74) *Attorney, Agent, or Firm* — Smith Baluch LLP

(57) ABSTRACT

A hybrid lens collimates light emitted by a light source via refraction and reflection. A folded optic element of the lens comprises an outer reflective surface, a lens output surface, and a hollow core comprising a sidewall having a curved profile, a core output boundary, and a core input opening through which the light emitted by the light source enters the hollow core. A reflector of the lens receives the light emitted by the light source, reflects a first portion of the light into the hollow core of the folded optic element, and directly transmits a second portion of the light into the hollow core without reflection by the reflector. In one example, the lens output surface has a diameter of 65 millimeters, the lens has a thickness (between the light source and the lens output surface) of about 13.5 millimeters and provides substantially collimated light with a beam divergence angle of 12 degrees or less.

30 Claims, 23 Drawing Sheets

Related U.S. Application Data

(60) Provisional application No. 62/563,549, filed on Sep. 26, 2017.

(51) Int. Cl.

| | | |
|---|---|---|
| *F21V 7/28* | (2018.01) | |
| *F21V 5/00* | (2018.01) | |
| *F21V 5/04* | (2006.01) | |
| *F21V 7/00* | (2006.01) | |
| *G02B 3/04* | (2006.01) | |
| *G02B 19/00* | (2006.01) | |
| *F21Y 115/10* | (2016.01) | |

(52) U.S. Cl.
CPC .................. *F21V 7/28* (2018.02); *G02B 1/14* (2015.01); *G02B 3/04* (2013.01); *G02B 19/0028* (2013.01); *F21Y 2115/10* (2016.08)

(56) References Cited

U.S. PATENT DOCUMENTS

| | | | |
|---|---|---|---|
| 6,547,423 B2 | 4/2003 | Marshall et al. | |
| 6,607,286 B2 | 8/2003 | West et al. | |
| 6,896,381 B2 | 5/2005 | Benitez et al. | |
| 7,224,924 B2 | 7/2007 | Kiyomoto et al. | |
| 7,329,029 B2 | 2/2008 | Chaves et al. | |
| 8,016,451 B2 | 9/2011 | Householder et al. | |
| 8,094,393 B2 | 1/2012 | Miñano et al. | |
| 9,310,052 B1* | 4/2016 | Shum | F21K 9/60 |
| 9,360,190 B1* | 6/2016 | Shum | G02B 19/0061 |
| 9,995,439 B1* | 6/2018 | Shum | F21V 17/105 |
| 2002/0080615 A1 | 6/2002 | Marshall et al. | |
| 2002/0085390 A1 | 7/2002 | Kiyomoto et al. | |
| 2005/0024744 A1* | 2/2005 | Falicoff | G02B 19/0061 359/737 |
| 2006/0067078 A1 | 3/2006 | Beeson et al. | |
| 2009/0129079 A1 | 5/2009 | Grotsch et al. | |
| 2009/0219716 A1 | 9/2009 | Weaver et al. | |
| 2013/0240928 A1* | 9/2013 | Jang | G02B 19/0028 257/98 |
| 2015/0131294 A1 | 5/2015 | Kuenzler et al. | |
| 2015/0308661 A1 | 10/2015 | Xi | |
| 2017/0102126 A1 | 4/2017 | Hou et al. | |
| 2017/0130935 A1 | 5/2017 | Hong | |

FOREIGN PATENT DOCUMENTS

| | | | |
|---|---|---|---|
| CN | 106594674 A | 4/2017 | |
| CN | 106764937 A | 5/2017 | |
| DE | 202011051423 | 1/2012 | |
| EP | 1 048 085 | 11/2007 | |
| EP | 2 484 964 A2 | 8/2012 | |
| JP | H06203617 | 7/1994 | |
| JP | 2011095660 A | 5/2011 | |
| JP | 2013-135141 A | 7/2013 | |
| JP | 2017-050246 A | 3/2017 | |
| KR | 20110109014 | 10/2011 | |
| WO | WO 2004/032250 | 4/2004 | |
| WO | WO 2014/091076 A1 | 6/2014 | |
| WO | WO-2014091076 A1 * | 6/2014 | ........... G02B 3/0056 |

OTHER PUBLICATIONS

CS&E PCT Collaborative Search and Examination Pilot Upload Peer Contribution dated Mar. 4, 2019, 61 pages.
Single Lenses. Ledil. Accessed at https://www.ledil.com/product-landing/single-lenses/#start on Nov. 19, 2019, 13 pages.
C16255_EVA-SS. Ledil. Accessed at https://www.ledil.com/product-card/?product=C16255_EVA-SS on Nov. 19, 2019, 2 pages.
MR16 Spotlight. Advanced Optoelectronic Technology Inc. Accessed at http://www.aot.com.tw/en/products.php?version=e&cmod=33&id=106 on Nov. 19, 2019, 2 pages.
Commercial Lighting Lighting the real world Version 19.04. LedLink Catalog. 2019. 10 pages.
Optical Energy Design& Devices. Herculux EN5.0 Catalog. 2019. 46 pages.
Product Approval. Herculux Mar. 3, 2019. 20 pages.
Data Sheet LL01CR-CFExxL02 XICATO. LedLink 2016. 5 pages.
Data Sheet LL01CR-CFExxL02 Cree. LedLink 2016. 6 pages.
International Search Report and Written Opinion in PCT/US2020/039728 dated Nov. 23, 2020, 13 pages.

* cited by examiner

| Radius 1 | 1.11099833 | mm |
| k | -6.018979 | |
| α1 | 0 | |
| α2 | 1.2184E-06 | |
| α3 | 9.6802E-11 | |
| α4 | 7.91E-15 | |
| c | 0.900091362 | 1/mm |
| α'4 | -3.77E-06 | |
| α'6 | -5.79E-11 | |
| c' | 0.020377 | 1/mm |
| k' | 1.497 | |
| γ | 39.8 | degrees |
| Routput | 18 | mm |

FIG. 3B

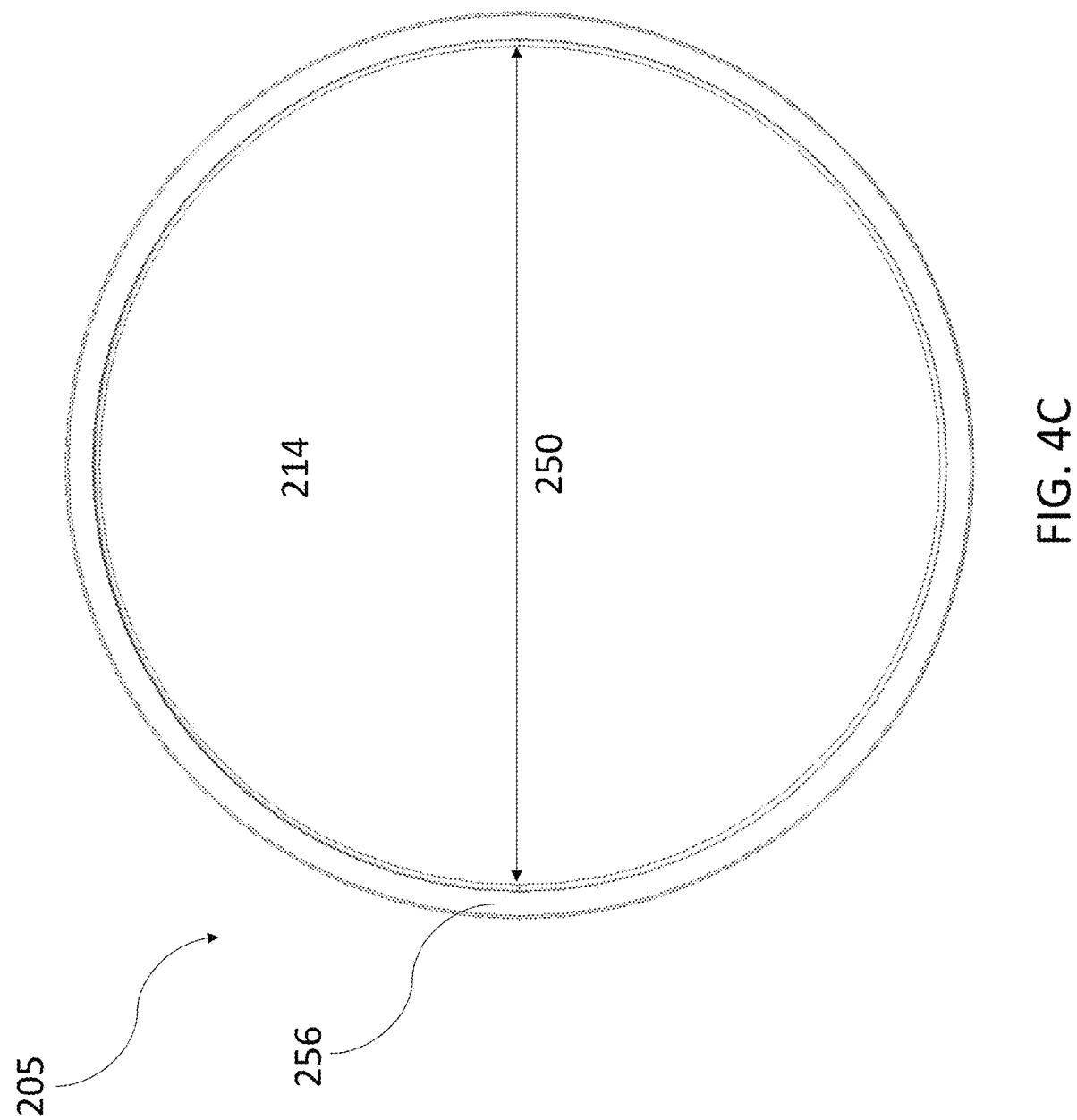

| Number of Grooves | 120 | |
|---|---|---|
| Pitch at the large rim | 1.70169602 | mm |
| Radius at beginning of groove (approx) | 5.5 | mm |
| Pitch at the funnel rim | 0.288 | mm |

FIG. 4G

| z (mm) | r (mm) | pitch (mm) | depth (mm) | z of groove bottom (mm) | $r^2$ | $r^4$ | $r^6$ | $r^8$ |
|---|---|---|---|---|---|---|---|---|
| 0.2768324 | 1 | | | | 1 | 1 | 1 | 1 |
| 0.69842898 | 2 | | | | 4 | 16 | 64 | 256 |
| 1.13601358 | 3 | | | | 9 | 81 | 729 | 6561 |
| 1.57809138 | 4 | | | | 16 | 256 | 4096 | 65536 |
| 2.02219039 | 5 | 0.2618 | 0.13069969 | 1.8913 | 25 | 625 | 15625 | 390625 |
| 2.46755988 | 6 | 0.3142 | 0.15707963 | 2.3105 | 36 | 1296 | 46656 | 1679616 |
| 2.91397923 | 7 | 0.3665 | 0.18325957 | 2.7307 | 49 | 2401 | 117649 | 5764801 |
| 3.36144877 | 8 | 0.4189 | 0.20943951 | 3.1520 | 64 | 4096 | 262144 | 16777216 |
| 3.81008519 | 9 | 0.4712 | 0.23561945 | 3.5745 | 81 | 6561 | 531441 | 43046721 |
| 4.26007959 | 10 | 0.5236 | 0.26179939 | 3.9983 | 100 | 10000 | 1000000 | 100000000 |
| 4.71167872 | 11 | 0.5760 | 0.28797933 | 4.4237 | 121 | 14641 | 1771561 | 214358881 |
| 5.16517593 | 12 | 0.6283 | 0.31415927 | 4.8510 | 144 | 20736 | 2985984 | 429981696 |
| 5.62090671 | 13 | 0.6807 | 0.34033921 | 5.2806 | 169 | 28561 | 4826809 | 815730721 |
| 6.07924652 | 14 | 0.7330 | 0.36651914 | 5.7127 | 196 | 38416 | 7529536 | 1475789056 |
| 6.54061002 | 15 | 0.7854 | 0.39269908 | 6.1479 | 225 | 50625 | 11390625 | 2562890625 |
| 7.00545093 | 16 | 0.8378 | 0.41887902 | 6.5866 | 256 | 65536 | 16777216 | 4294967296 |
| 7.47426255 | 17 | 0.8901 | 0.44505896 | 7.0292 | 289 | 83521 | 24137569 | 6975757441 |
| 7.94757846 | 18 | 0.9425 | 0.47123889 | 7.4763 | 324 | 104976 | 34012224 | 1.1602E+10 |
| 8.42597366 | 19 | 0.9948 | 0.49741884 | 7.9286 | 361 | 130321 | 47045881 | 1.6984E+10 |
| 8.91006579 | 20 | 1.0472 | 0.52359878 | 8.3865 | 400 | 160000 | 64000000 | 2.56E+10 |
| 9.40051661 | 21 | 1.0996 | 0.54977871 | 8.8507 | 441 | 194481 | 85766121 | 3.7823E+10 |
| 9.89803862 | 22 | 1.1519 | 0.57595865 | 9.3221 | 484 | 234256 | 113379904 | 5.4876E+10 |
| 10.4033719 | 23 | 1.2043 | 0.60213859 | 9.8012 | 529 | 279841 | 148035889 | 7.8311E+10 |
| 10.9173359 | 24 | 1.2566 | 0.62831853 | 10.2890 | 576 | 331776 | 191102976 | 1.1008E+11 |
| 11.4407818 | 25 | 1.3090 | 0.65449847 | 10.7863 | 625 | 390625 | 244140625 | 1.5259E+11 |
| 11.9746198 | 26 | 1.3614 | 0.68067841 | 11.2939 | 676 | 456976 | 308915776 | 2.0883E+11 |
| 12.5198163 | 27 | 1.4137 | 0.70685835 | 11.8130 | 729 | 531441 | 387420489 | 2.8243E+11 |
| 13.0773968 | 28 | 1.4661 | 0.73303829 | 12.3444 | 784 | 614656 | 481890304 | 3.7798E+11 |
| 13.6484486 | 29 | 1.5184 | 0.75921822 | 12.8892 | 841 | 707281 | 594823321 | 5.0025E+11 |
| 14.2341239 | 30 | 1.5708 | 0.78539816 | 13.4487 | 900 | 810000 | 729000000 | 6.561E+11 |
| 14.8356429 | 31 | 1.6232 | 0.81157810 | 14.0241 | 961 | 923521 | 887503681 | 8.5289E+11 |
| 15.4542972 | 32 | 1.6755 | 0.83775804 | 14.6165 | 1024 | 1048576 | 1073741824 | 1.0995E+12 |
| 15.7704742 | 32.5 | 1.7017 | 0.85084801 | 14.9196 | 1056.25 | 1115664.06 | 1178420166 | 1.2447E+12 |

FIG. 4H

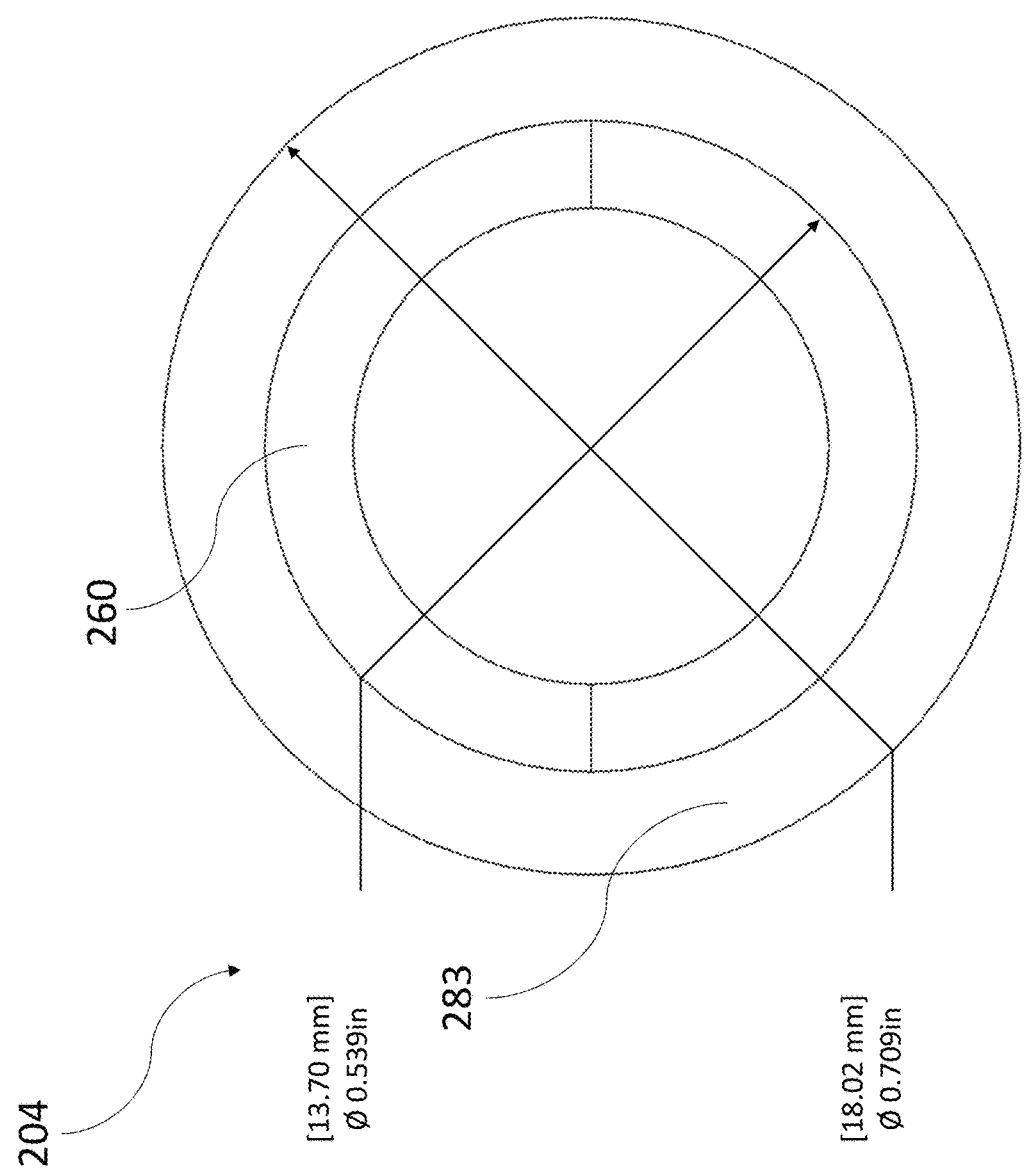

Inset A

FOLDED OPTICS METHODS AND APPARATUS FOR IMPROVING EFFICIENCY OF LED-BASED LUMINAIRES

CROSS-REFERENCE TO RELATED APPLICATION

The present application is a Bypass Continuation Application of International PCT Application PCT/US2018/052996, filed Sep. 26, 2018, entitled "FOLDED OPTICS METHODS AND APPARATUS FOR IMPROVING EFFICIENCY OF LED-BASED LUMINAIRES," which claims priority to U.S. provisional application Ser. No. 62/563,549, filed Sep. 26, 2017, entitled "HIGH EFFICIENCY HYBRID OPTIC FOR LUMINAIRES." Each of the aforementioned applications is incorporated by reference herein in its entirety.

BACKGROUND

Conventional luminaires, including downlights and spotlights, often include optical elements to focus light emitted by a light source. Optical elements may also be included in luminaires to improve the light coupling efficiency, defined as the ratio of 1) the luminous flux radiated out of the lighting system to the surrounding environment and 2) the luminous flux generated by the light source. The design of a luminaire that exhibits relatively high light coupling efficiency typically requires larger optics, which generally lead to a larger size, greater weight, and higher costs. Furthermore, built environments, such as a multi-family housing or a commercial office, also typically have limited ceiling or wall space available for the installation of luminaries, which can constrain the size and thus the performance of luminaries.

SUMMARY

The Inventors have recognized and appreciated that folded optics provide attractive options for light emitting diode (LED) downlights or spotlights to control beam angle and other aspects of generated light. However, the Inventors also have recognized and appreciated certain challenges that arise when attempting to gain high efficiencies using such folded optics concepts.

For example, with reference to FIG. 1A, light rays emitted at large emission angles, e.g., light rays 199, may be refracted and thus would not radiate out of the optic 100. As a result, the light coupling efficiency of folded optics is relatively low at 60%-80%, as compared to conventional optics that can provide 80%-95% efficiency.

In view of the foregoing, various inventive implementations disclosed herein relate to folded optics methods and apparatus to improve efficiency of LED-based luminaires (e.g., a downlight or spotlight incorporating an LED lighting source). In one or more implementations, a hybrid optic apparatus includes a folded optic core and a reflective surface at the base of the optic apparatus. In these and other implementations, the reflective surface collimates the widest rays of radiation emitted by one or more LED light sources of an LED-based luminaire, thereby increasing the efficiency of the optic as compared to an optic only including the folded optic core.

In sum, in one example, a hybrid lens collimates light emitted by a light source via refraction and reflection. A folded optic element of the lens comprises an outer reflective surface, a lens output surface, and a hollow core comprising a sidewall having a curved profile, a core output boundary, and a core input opening through which the light emitted by the light source enters the hollow core. A reflector of the lens receives the light emitted by the light source, reflects a first portion of the light into the hollow core of the folded optic element, and directly transmits a second portion of the light into the hollow core without reflection by the reflector. In one example, the lens output surface has a diameter of 65 millimeters, the lens has a thickness (between the light source and the lens output surface) of about 13.5 millimeters and provides substantially collimated light with a beam divergence angle of 12 degrees or less.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 3B is a table detailing the various design parameters for a particular design of a hybrid optic apparatus.

FIG. 4C is a top view of the folded optic element of FIG. 4A.

FIG. 4G is a table of parameters related to a prismatic structure formed on the reflective outer surface of the folded optic element of FIG. 4A.

FIG. 4H is a table detailing the geometry of the hybrid optic apparatus based on the design parameters of FIG. 3B.

FIG. 5C is a top view of the reflector element of FIG. 5A.

DETAILED DESCRIPTION

Following below are more detailed descriptions of various concepts related to, and implementations of, folded optics methods and apparatus for improving the light coupling efficiency of LED-based luminaires (e.g., downlights and spotlights). It should be appreciated that various concepts introduced above and discussed in greater detail below may be implemented in numerous ways. Examples of specific implementations and applications are provided primarily for illustrative purposes so as to enable those skilled in the art to practice the implementations and alternatives apparent to those skilled in the art.

The figures and example implementations described below are not meant to limit the scope of the present implementations to a single embodiment. Other implementations are possible by way of interchange of some or all of the described or illustrated elements. Moreover, where certain elements of the disclosed example implementations may be partially or fully implemented using known components, in some instances only those portions of such known components that are necessary for an understanding of the present implementations are described, and detailed descriptions of other portions of such known components are omitted so as not to obscure the present implementations.

Figure 1A:
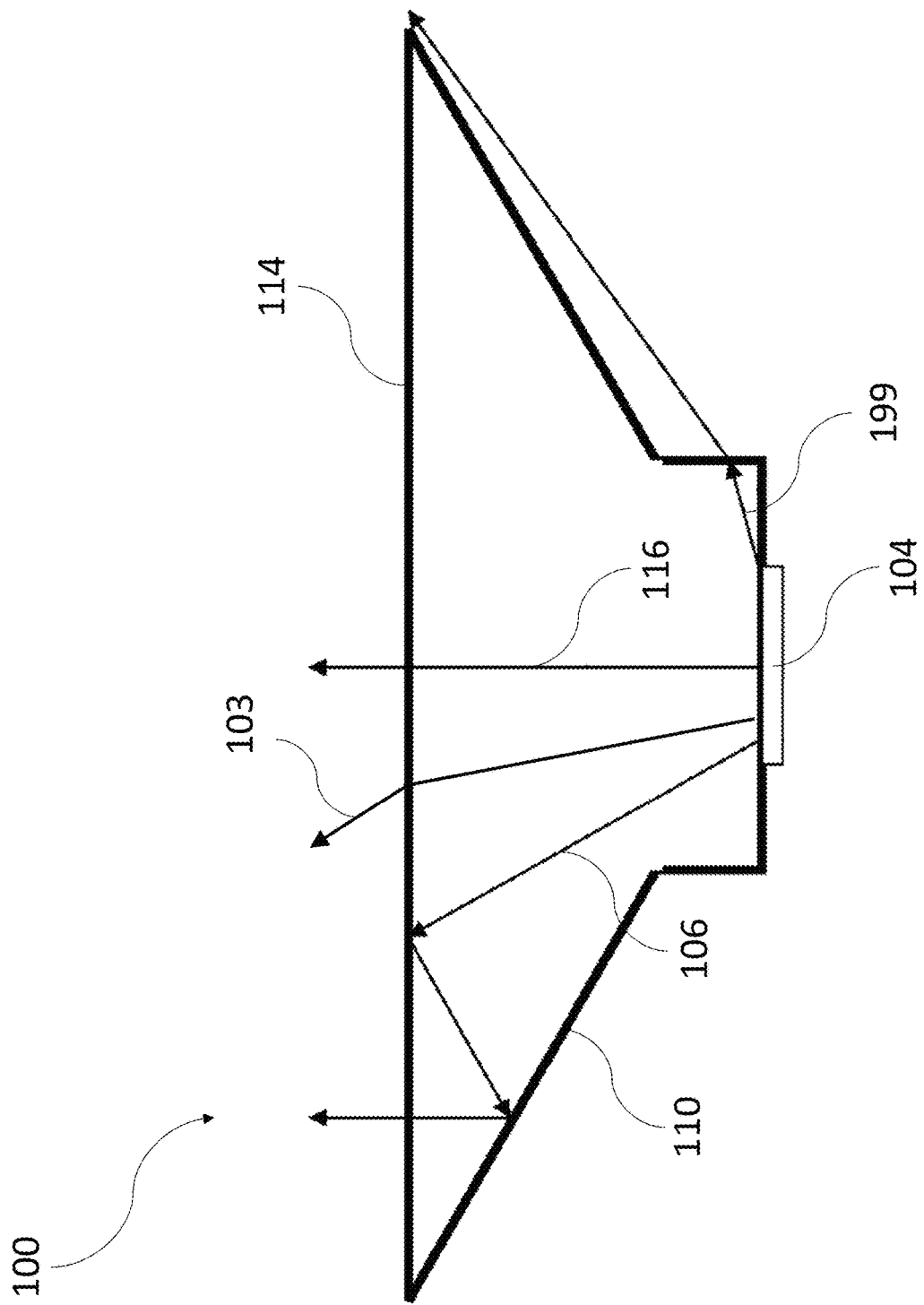
FIG. 1A shows a conventional folded optic element with no interior hollow core.

One conventional approach to reducing the size of optical elements in a luminaire is to use a folded optic. An illustration of a conventional folded optic design is shown in FIG. 1A, which includes a folded optic element 100 coupled to a light source 104. Light emitted by the light source 104 may directly or indirectly radiate out of the optic 100 depending on the emission angle, which is defined relative to the normal axis of the light source 104, and the position on the light source 104. For example, at a particular position on the light source 104, light may radiate directly out of the optic 100 via transmission if light is emitted at small emission angles, e.g., light rays 103, such that the light rays 103 at the output surface 114 are below the critical angle for total internal reflection (TIR). Light may also indirectly radiate out of the optic 100 if emitted at intermediate emission angles, e.g., light rays 106. As shown in FIG. 1A, the light ray 106 may be reflected via TIR at the output surface 114 and reflected at the reflective outer surface 110 such that the light ray 106 transmits through the output surface 114 at near normal incidence. By utilizing both the output surface 114 and the reflective outer surface 110 to indirectly radiate light emitted at larger emission angles, the thickness of the folded optic 100 can be reduced by nearly half compared to conventional TIR collimators.

However, the folded optic design shown in FIG. 1A typically suffers from a lower light coupling efficiency as not all of the light emitted by the light source 104 is coupled out of the folded optic 100. For example, light rays emitted at large emission angles, e.g., light ray 199, do not get reflected by the folded optic element 100 and thus do not radiate out. As a result, the folded optic design of FIG. 1A typically exhibits a light coupling efficiency of about 60-80%, whereas conventional TIR collimators typically exhibit a light coupling efficiency of about 80%-95%. Additionally, the use of only the output surface 114 and the reflective outer surface 110 to indirectly radiate light at intermediate emission angles also provides less control over the spatial and angular intensity distribution of light, which may result in structured light beams, such as localized spots and/or rings of high and low intensity. Structured light is considered to be aesthetically undesirable, particularly for luminaires disposed in multifamily and residential spaces.

Figure 1B:
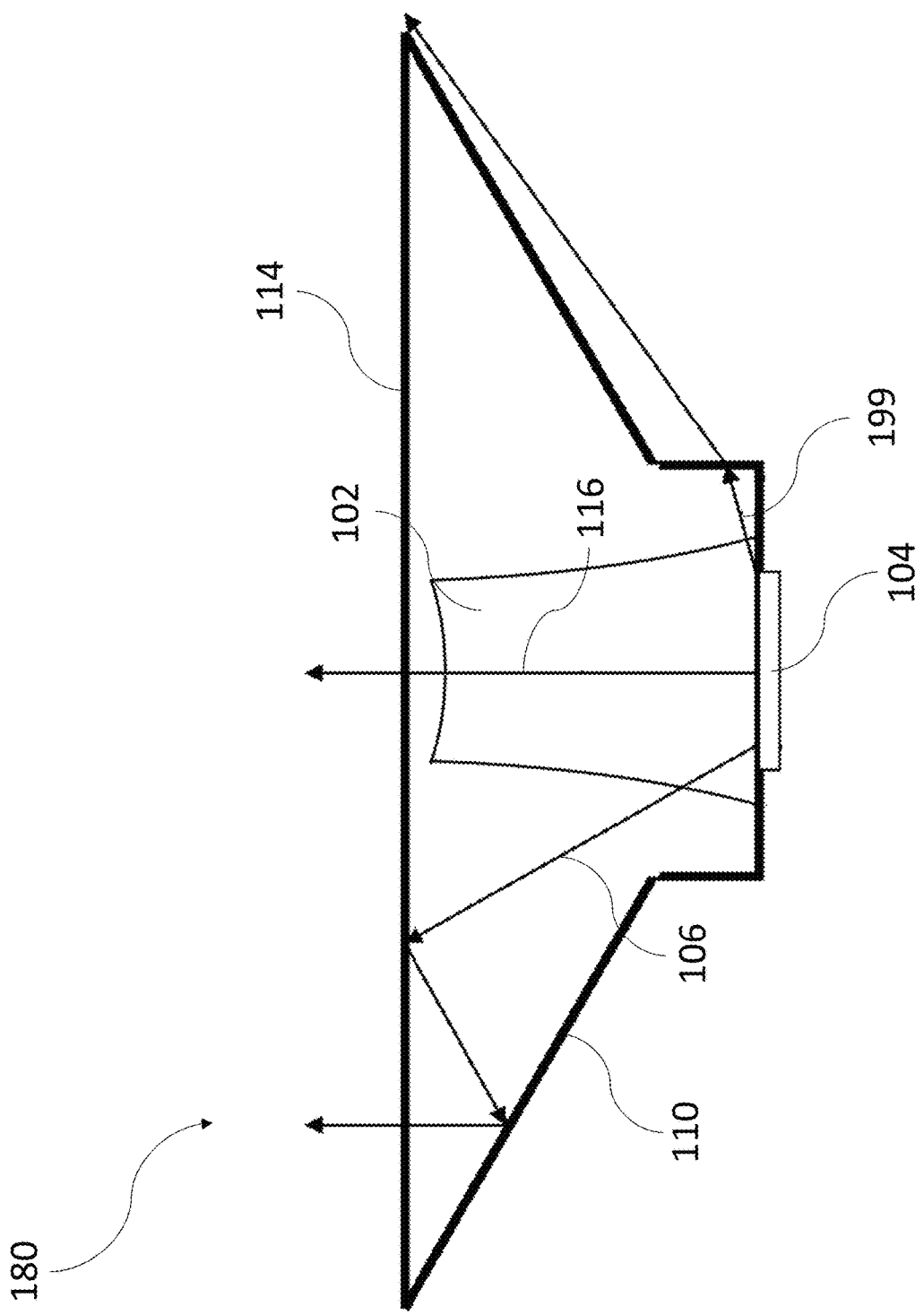
FIG. 1B shows a conventional folded optic element with an interior hollow core.

FIG. 1B shows another conventional folded optic element design where a folded optic element 180 includes a hollow core 102 (also referred to herein as "funnel") coupled to the light source 104. At a particular position on the light source 104, light emitted at intermediate emission angles, e.g., light ray 106, is first refracted by the sidewall of the hollow core 102 and then reflected via TIR at the output surface 114 and reflected at the reflective outer surface 110 until the light rays 106 transmit through the output surface 114 at near normal incidence. The inclusion of the hollow core 102 provides an additional surface, e.g., the hollow core sidewall 112, to modify the spatial and angular intensity distribution so as to provide a more aesthetically desirable light beam. However, the folded optic element design of FIG. 1B still suffers from poor light coupling efficiency.

The present disclosure is thus directed towards inventive apparatuses and methods for increasing the light coupling efficiency of luminaires, such as downlights or spotlights, which incorporate at least one light source. In some implementations, a hybrid optic apparatus is employed to improve the light coupling efficiency, wherein the hybrid optic apparatus includes a folded optic element to focus light emitted by a light source in lighting systems disposed in confined ceiling or wall spaces. A reflector element positioned at the base of the folded optic element may also be included to couple light emitted at large emission angles to improve the light coupling efficiency. The design of the hybrid optic element may be further tailored to accommodate lighting systems with constrained dimensions, variable light source sizes, desired output beam angles, and a smooth spatial and angular intensity distribution.

Figure 2:
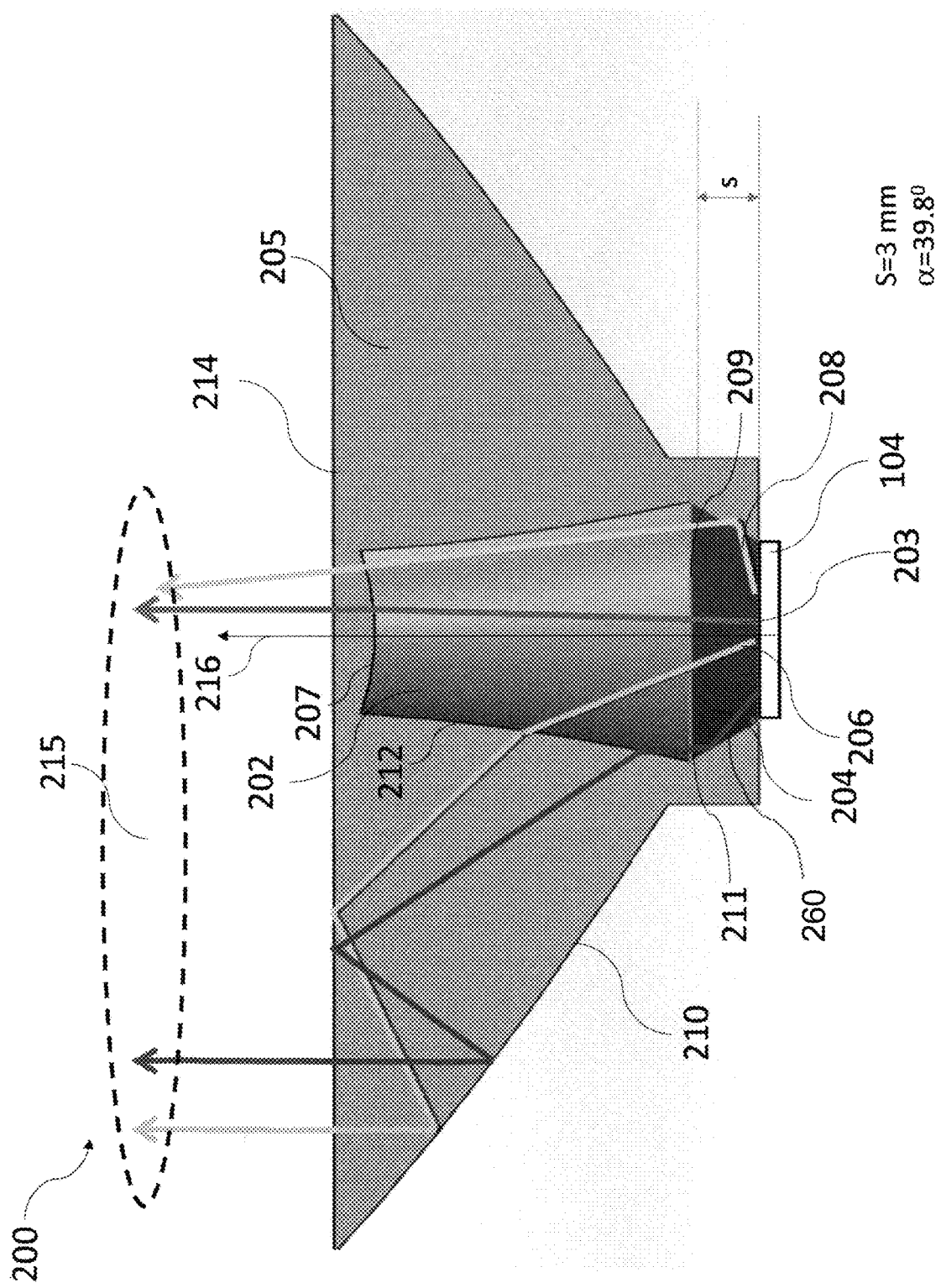
FIG. 2 shows an exemplary hybrid optic apparatus, according to some implementations of the disclosure.

FIG. 2 illustrates an exemplary design for a hybrid optic apparatus 200 according to one inventive implementation. The hybrid optic 200 comprises a folded optic element 205 with a hollow core 202 and a reflector element 204 having a reflective surface 260. A light source 104 is shown for reference in relation to the hybrid optic 200. At a particular position on the light source 104, light emitted at small emission angles, e.g., light rays 203, can radiate directly out of the output surface 214 of the hybrid optic 200. Light emitted at intermediate emission angles, e.g., light ray 206, can indirectly radiate out of the optic 200 via refraction along the hollow core sidewall 212, TIR at the output surface 214, and reflection at the reflective outer surface 210. Light emitted at large emission angles is first reflected by the reflective surface 260 and may either: (1) radiate directly out of the output surface 214, e.g., light ray 208, similar to the light rays 203 emitted at small emission angles or (2) refract along the hollow core sidewall 212, e.g., light ray 211, followed by TIR at the output surface 214, and reflection at the reflective outer surface 210. In this manner, light emitted across all angles at a particular position along the light source 104 may be substantially coupled out of the hybrid optic 200, thereby increasing the light coupling efficiency.

The manner in which light emitted by the light source 104 couples out of the hybrid optic 200 depends on both the particular position on the light source 104 and the emission angle. For simplicity, light emitted by the light source 104 may instead be grouped together according to the particular surface the light rays enter in the hybrid optic 200, regardless of the position on the light source 104 and the emission angle. Following the various optical paths described above, a first light ray bundle (i.e., a collection of light rays) may be defined as light that directly radiates out of the hybrid optic 200 through the output surface 214, e.g., light rays 203 and 208. A second light ray bundle may be defined as light that indirectly radiates out of the hybrid optic 200 via refraction along the hollow core sidewall 212, TIR at the output surface 214, and reflection at the reflective outer surface 210, e.g., light rays 206 and 211.

Accordingly, the hybrid optic 200 may be designed by considering the respective surfaces that reflect and/or refract the first and second light bundles described above. For instance, the curvature of the hollow core sidewall 212 and the reflective outer surface 210 affects the coupling efficiency of the second light bundle and the curvature of the reflective surface 260 and the core output boundary 207 affects the coupling efficiency of the first light bundle. The core output boundary 207 corresponds to the edge of the hollow core sidewall 212 nearest the output surface 214. The core output boundary 207 may define a surface of the hollow core 202 at the end of the hollow core sidewall 212 proximate to the output surface 214.

The curvature of each respective surface of the hybrid optic 200 may also depend on other desired output characteristics of the luminaire, such as the desired spatial and angular intensity distribution. For example, the intensity distribution may be represented by f(x), where x is either the position or the angle of the light coupled out of the hybrid optic 200. A sufficiently smooth intensity distribution may be achieved if f(x) and the first derivative, df/dx(x), exhibit few, if any, discontinuities and the second derivative, $d^2f/dx^2(x)$, exhibit few, if any, inflection points, such that the light appears to be non-structured (e.g., no observable rings of higher or lower intensity) to the human eye.

Additional constraints may also be imposed on the hybrid optic 200, which can affect the curvature and size of each respective surface of the hybrid optic 200. For example, the design of the hybrid optic 200 may depend on the spatial and angular distribution of light rays emitted from the light source 104. For instance, it may be preferable in some implementations for the hybrid optic 200 to be relatively larger than the light source 104 such that the light rays emitted by the light source 104 do not substantially vary as a function of position. However, dimensional constraints may also be imposed where the hybrid optic 200 is limited to a particular form factor defined by the luminaire and/or the amount of space available in a ceiling or a wall in the case of recessed lighting systems. The design of the hybrid optic 200 may also be constrained by the materials used to form the hybrid optic 200. In particular, the refractive index of the folded optic element 205 affects the critical angle for TIR, which in turn, may affect the curvature and the resultant size of the hybrid optic 200.

In some implementations, the curvature of the hollow core sidewall 212, the core output boundary 207, the reflective surface 260, and the reflective outer surface 210 may be designed using free form surfaces, e.g., non-uniform rational basis splines (NURBS), which are surfaces that are not constrained by a particular mathematical form and can thus be tailored to a particular set of constraints and desired metrics, e.g., the light coupling efficiency, the spatial intensity distribution, and the angular intensity distribution. However, the determination of a free form surface may be very time consuming and/or computationally expensive.

Therefore, in some implementations, constraints may be imposed on the mathematical form describing the curvature of the hollow core sidewall 212, the core output boundary 207, the reflective surface 260, and the reflective outer surface 210. For instance, the curves may be assumed to be a conical surface, which may include, but is not limited to spherical, paraboloidal, ellipsoidal, and hyperboidal surfaces. In some instances, the curves may be general aspherical profile that, in part, includes, polynomial terms of varying even order of the form (e.g., $x^2$, $x^4$, $x^6$, $x^8$). With this approach, the time and computational cost to design the hybrid optic 200 may be substantially reduced by reducing the number of free parameters and/or possible solutions that each respective surface in the hybrid optic 200 may have to sufficiently meet the desired output characteristics and constraints described above as well as providing a smooth function where convergence in design refinement is readily more attainable.

Figure 3A:
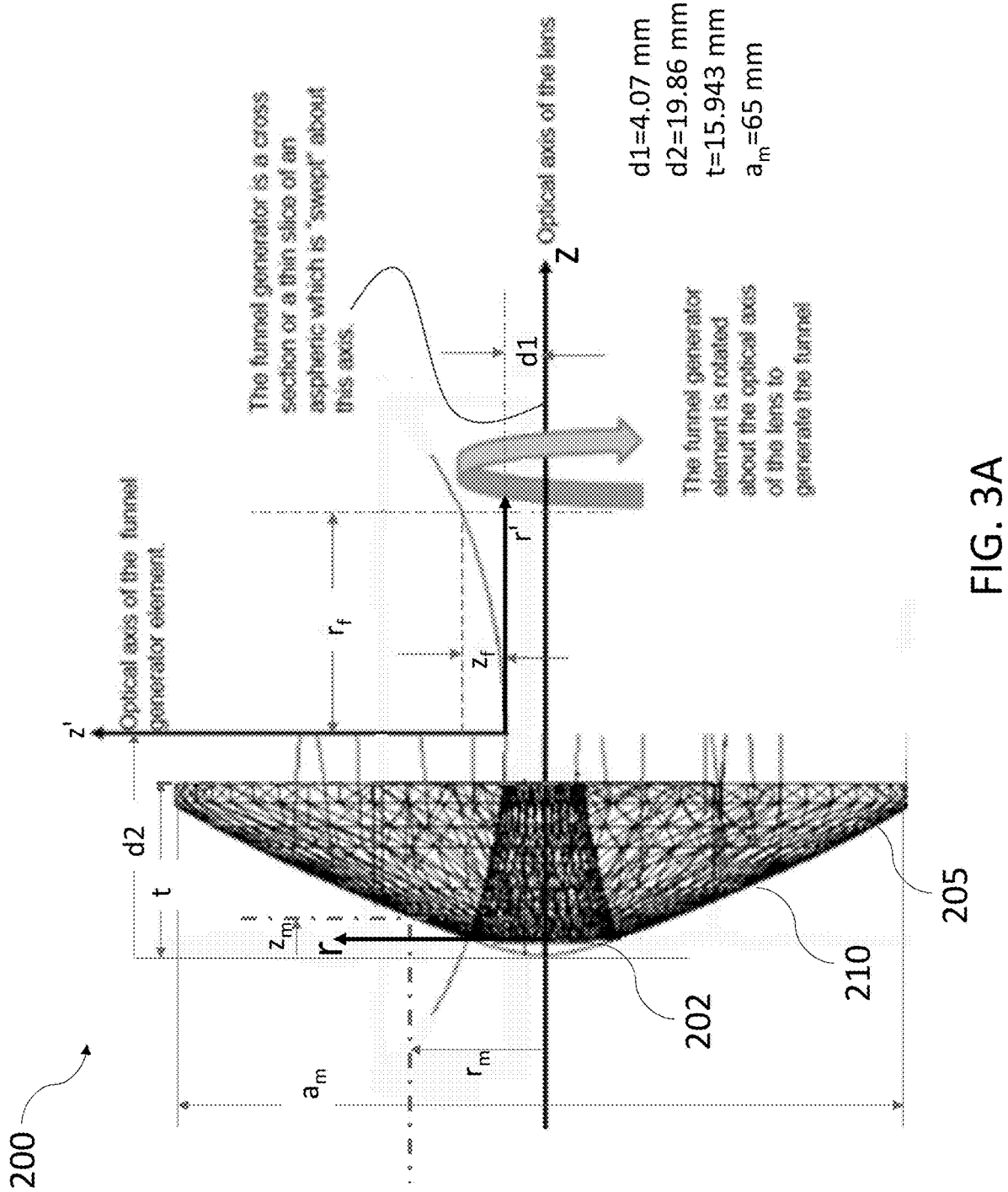
FIG. 3A shows the exemplary hybrid optic apparatus of FIG. 2, detailing the design of the hollow core and the reflective outer surface.

In one example, the hybrid optic 200 may be an axisymmetric structure formed by sweeping the cross-sectional profiles of the hollow core sidewall 212, the core output boundary 207, the reflective surface 260, and the reflective outer surface 210 about the optical axis, z, of the hybrid optic 200. The hollow core sidewall 212 and the reflective outer surface 210 may be constrained to have an aspheric profile. In particular, the hollow core sidewall 212 may be described by the following equation, $$z' = \frac{c'r'^2}{1+\sqrt{1-(1+k')c'^2r'^2}} + a'_4 r'^4 + a'_6 r'^6 \quad (1)$$

where c' is the curvature, k' is the conic order, and $a'_4$ and $a'_6$ are aspheric coefficients for each polynomial term. For Eq. (1), the variables r' and z' represent a radial distance along the radial axis and a sag along the optical axis of the aspheric profile of Eq. (1), respectively. The variables r' and z' form a second coordinate system specific to the aspherical profile of the hollow core sidewall 212, which may be orthogonal to the radial axis, r, and the optical axis, z, of the hybrid optic 200 as shown in FIG. 3A. The position of the origin of the second coordinate system in relation to r and z of the hybrid optic 200 may be translated to adjust a portion of the aspheric profile included as the hollow core sidewall 212, as illustrated in FIG. 3A. In this case, the translation of the second coordinate system is such that offsets along z' are along the r axis and offsets along r' are along the z axis.

The reflective outer surface 210 may be described by the following equation, $$z = \frac{cr^2}{1+\sqrt{1-(1+k)c^2r^2}} + a_1 r^2 + a_2 r^4 + a_3 r^6 + a_4 r^8 \quad (2)$$

where c is the curvature, k is the conic order, and $a_1$, $a_2$, $a_3$, and $a_4$ are aspheric coefficients for each polynomial term. For Eq. (2), the variables r and z represent the radial distance along the radial axis of the hybrid optic 200 and the sag of the aspheric profile along the optical axis of the hybrid optic 200. Similar to the hollow core sidewall 212, the aspheric profile in Eq. (2) may be translated along the optical axis, z, to adjust the portion of the aspheric profile that is included to form the reflective outer surface 210. For instance, a portion of the aspheric profile proximate to the vertex may not be included to allow for an input opening at the core input opening 209 of the folded optic element 205.

The reflective surface 260 may be assumed to have a linear profile oriented at an angle, γ, relative to the optical axis, z, such that the reflective surface 260 forms a truncated cone with a circular cross section along the plane defined by the radial axis, r, and a polar axis, θ, of the hybrid optic 200. The edge of the reflector element 204 coincident at the core input opening 209 may also be constrained to be contiguous with the edge of the hollow core 202 coincident at the core input opening 209 such that light emitted by the light source 104 intersects only the reflective surface 260, the hollow core sidewall 212, and the core output boundary 207.

The core output boundary 207 may be assumed to have spherical profile with a radius of curvature, $R_{output}$. In this manner, the core output boundary 207 defines a surface having spherical curvature, which may focus, at least in part, the first light ray bundle. The spherical profile may also be translated along the optical axis, z to position the core output boundary 207 at a distance from the output surface 214 based on the vertex of the spherical profile.

The terms c', k', $a'_4$, $a'_6$, c, k, $a_1$, $a_2$, $a_3$, $a_4$, γ, $R_{output}$, may be adjusted in concert to meet the desired metrics under a particular set of constraints according to a particular application. For instance, this exemplary design approach may be used to design a hybrid optic 200 that outputs light rays 215 within a 12 degree divergence angle, defined relative to the optical axis of the hybrid optic 200. FIG. 3B shows exemplary values for the various terms for a particular application where the desired clear aperture is 32.5 mm (the clear aperture is defined as the radius of the output surface 214 that may be used to couple out light from the light source 104), a thickness of less than 16 mm, and light rays 215 being limited to angles less than about 12 degrees from the optical axis of the hybrid optic 200.

The folded optic element 205, as described above, includes a hollow core 202 such that a first light bundle directly radiates out of the hybrid optic 200 through the core output boundary 207 and a second light bundle indirectly radiates out of the hybrid optic 200 via refraction along the hollow core sidewall 212. FIGS. 4A-4F show various views of an exemplary folded optic element 205. It should be appreciated that the top, bottom, front, rear, left, and right views of the folded optic element 205 shown in FIGS. 4A-4F are intended to provide orientation and may not be representative of the orientation in which the folded optic element 205 is disposed in a luminaire.

Figure 4A:
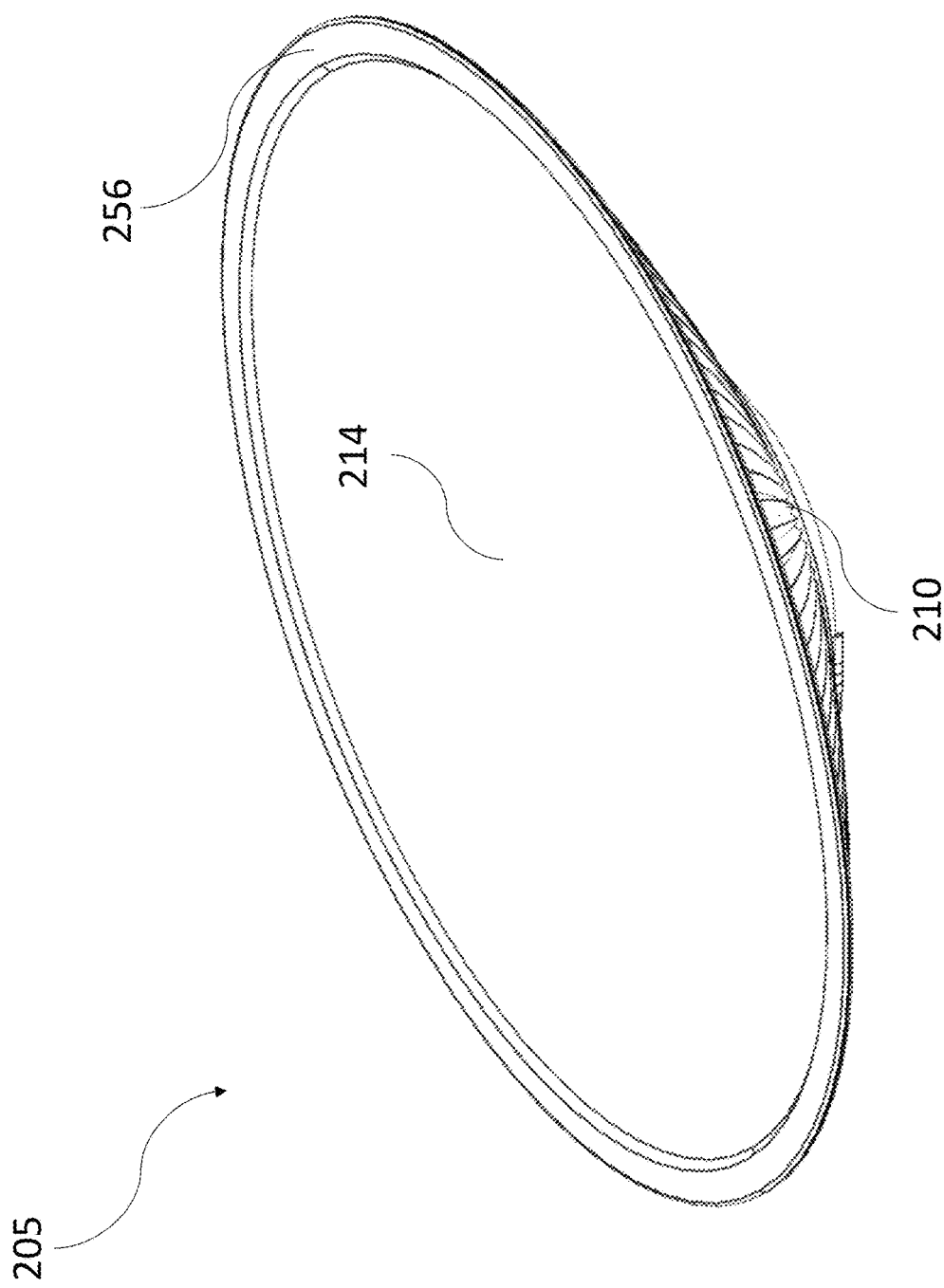
FIG. 4A is a top, perspective view of a folded optic element, according to some implementations of the disclosure, in a hybrid optic apparatus.

FIG. 4A shows a top, perspective view of the folded optic element 205 detailing the output surface 214. In some implementations, the folded optic element 205 may include a lip 256 disposed along the periphery of the output surface 214, as shown in FIG. 4C, to facilitate mechanical coupling of the hybrid optic apparatus 200 to a luminaire and/or to support a secondary optical element to further modify the spatial and angular intensity distribution of the light rays 215. For example, a retaining ring may be used to clamp the hybrid optic 200 to a housing of the luminaire where the clamping force is applied primarily to the lip 256. In some implementations, the lip 256 may protrude from the output surface 214 of the folded optic element 205 to reduce damage (e.g., scratches) of the output surface 214 during assembly and/or operation.

Figure 4B:
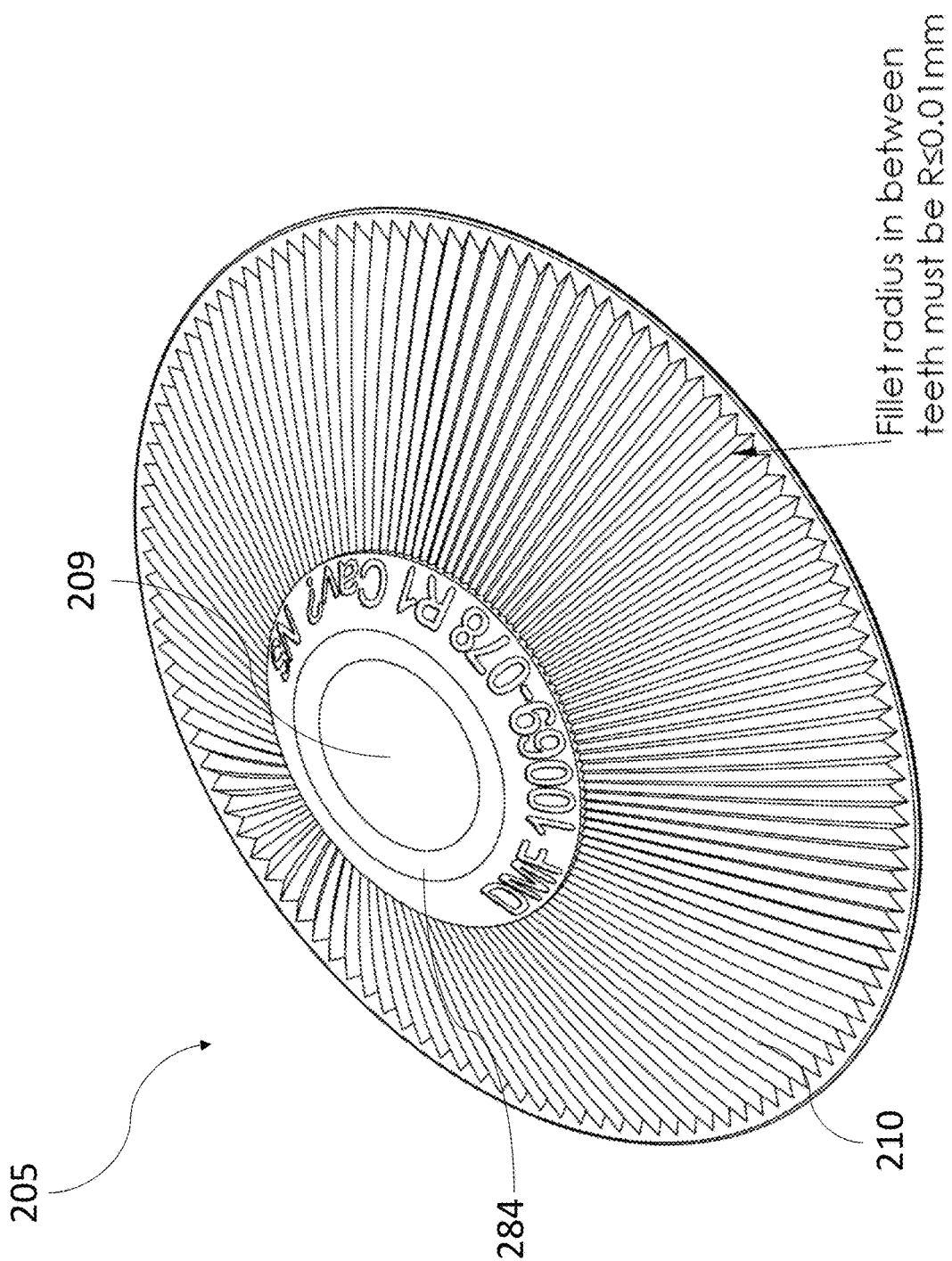
FIG. 4B is a bottom, perspective view of the folded optic element of FIG. 4A.
Figure 4D:
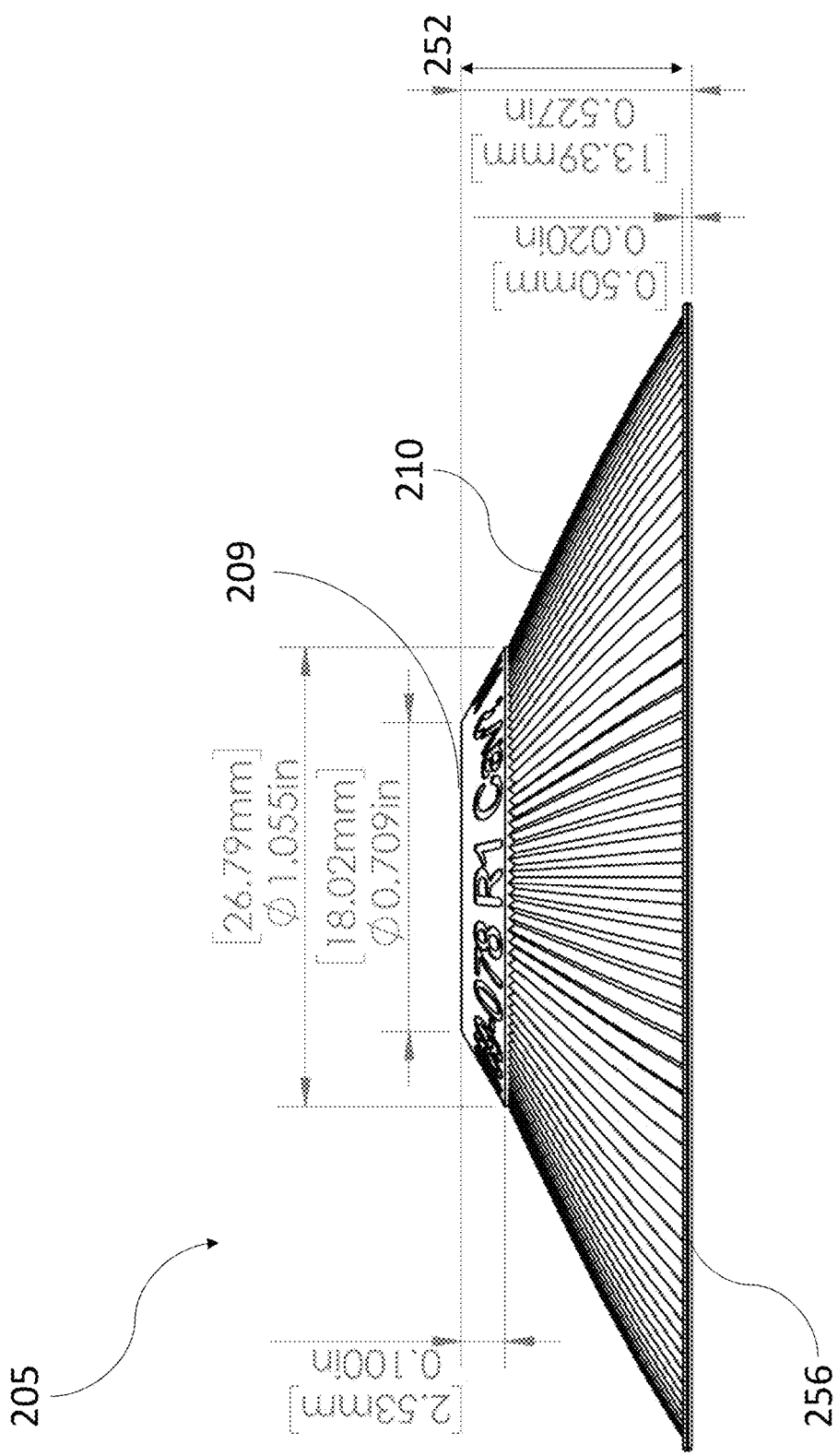
FIG. 4D is a front view of the folded optic element of FIG. 4A.
Figure 4E:
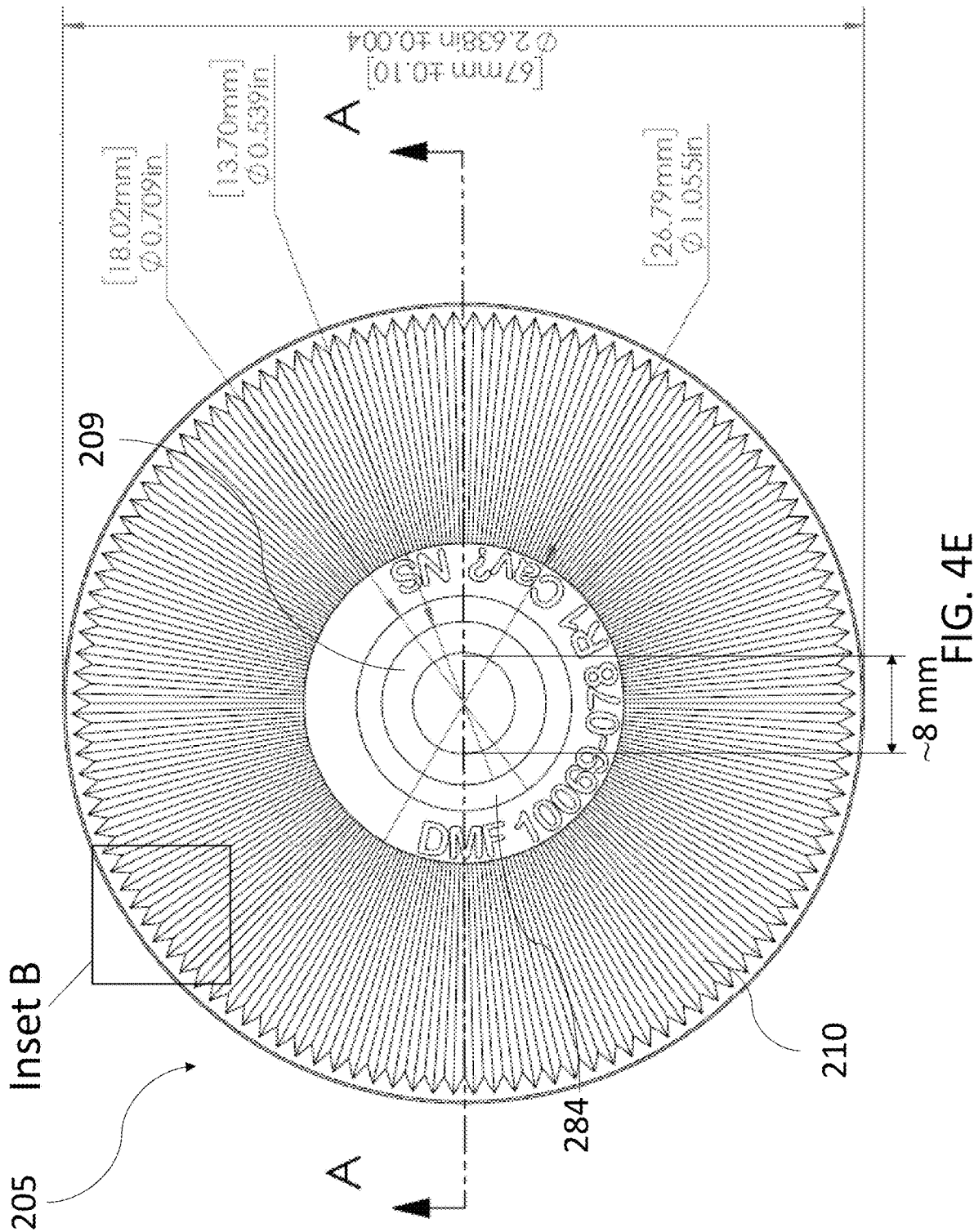
FIG. 4E is a bottom view of the folded optic element of FIG. 4A.
Figure 4F:
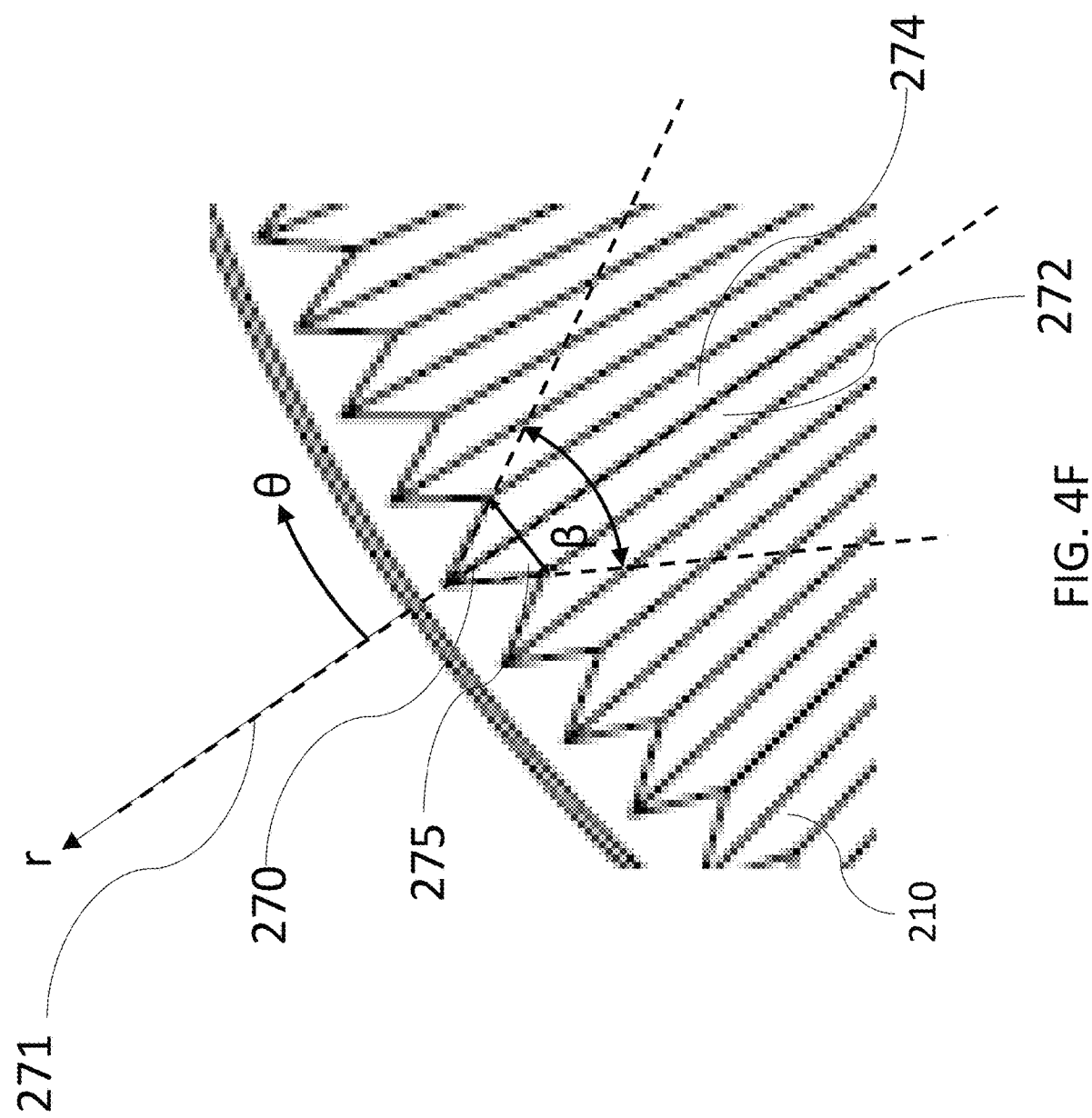
FIG. 4F is a magnified view of the prismatic structure of the folded optic element of FIG. 4A corresponding to the inset B of FIG. 4E.

FIG. 4B shows a bottom, perspective view of the folded optic element 205 detailing the reflective outer surface 210. As described above, the primary function of the reflective outer surface 210 is to reflect light rays in the second light bundle, e.g., light rays 206 and 211, such that the light rays are oriented at a preferred angle relative to the output surface 214 (e.g., near normal incidence to the output surface 214). FIGS. 4D and 4E show a front view and a bottom view, respectively, of the reflective outer surface 210 detailing the prismatic structure. In some implementations, the reflective outer surface 210 may be a prismatic structure comprised of a series of grooves 270 each having a V-shaped cross section along the plane defined by the radial axis, r, and the polar axis, θ, of the hybrid optic 200 and a groove axis 271 aligned parallel to the radial coordinate, r, of the hybrid optic 200 and conforming to the curvature of the reflective outer surface 210, as shown in FIG. 4D. The grooves 270 may be configured to reflect light rays 206 and 211 via TIR along two facets 272 and 274 forming the groove 270, as shown in FIG. 4F.

The grooves 270 may be further characterized by a groove angle, β, defined as the angle between the groove facets 272 and 274. The β may provide an additional parameter to tune the spatial and angular intensity distribution of light rays 215. For instance, a β, of about 90.75 degrees to about 91.75 degrees, preferably about 91.25 degrees has been shown to result in a beam from the hybrid optic 200 that has a relatively smooth spatial and angular intensity distribution. In contrast, a β of 90 degrees typically used in conventional TIR collimators (e.g., 3M BEF films), has been shown to result in a "double hump" beam, where the intensity decreases at the center of the light beam along the optical axis, z, of the hybrid optic 200, which is aesthetically undesirable.

FIG. 4G shows an exemplary set of constraints for a prismatic structure formed from a plurality of grooves 270 disposed along the reflective outer surface 210 of the hybrid optic 200 to be used for the exemplary design of FIG. 3B. Also shown are the pitch 275 of the grooves 270 at the near the output surface 214 and the core input opening 209. FIG. 4H shows tabulated values of the aspheric profile describing the reflective outer surface 210 and the pitch 275 of the grooves 270 used for this particular design. FIG. 4H also shows tabulated values of the polynomial terms according to Eq. (2).

In some implementations, the reflective outer surface 210 may be coated with a reflective material to facilitate the reflections of light rays 206 and 211. For example, the reflective outer surface 210 may be coated with various metals including, but not limited to silver, aluminum, chromium, and gold. In some instances, the coating may be a dielectric Bragg mirror configured to have a photonic band gap that substantially overlaps with the wavelengths of light emitted by the light source 104. Adhesion layers may be disposed between the reflective outer surface 210 and the coating to reduce delamination of the coating during operation and/or handling. For instance, adhesion layers formed of thin layers of chromium or titanium (less than 10 nm thick) may be used in implementations where the reflective coating is another metal, such as gold.

In some implementations, the reflective outer surface 210 may extend from the core input opening 209 to the output surface 214 of the folded optic element 205. In some implementations, the reflective outer surface 210 may cover only a portion of the folded optic element 205 along the exterior surface between the core input opening 209 and the output surface 214. For example, FIG. 4D shows that the prismatic structure of the reflective outer surface 210 terminates at the lip 256 of the output surface 214 and at a distance from the core input opening 209 of the folded optic element 205. The portion of the exterior surface of the folded optic element 205 between the core input opening 209 and the reflective outer surface 210 may correspond to light rays emitted at emission angles at various positions on the light source 104 that intersect the reflective surface 260.

In instances where the reflective outer surface 210 is prismatic, the prismatic structure may be fabricated concurrently with the main body of the folded optic element 205. In some instances, the prismatic structure may be formed post-fabrication using methods including, but not limited to, milling, stamping, grinding, doping (e.g., to form a prismatic structure based on a contrast in refractive index), and any other method known to one of ordinary skill in the art. In implementations where the reflective outer surface 210 has a coating, such as a metal or a dielectric Bragg mirror, deposition of the coatings may be accomplished using various deposition methods including, but not limited to, thermal evaporation, e-beam evaporation, sputtering, dip coating, chemical vapor deposition, and any other method known to one of ordinary skill in the art.

Figure 4I:
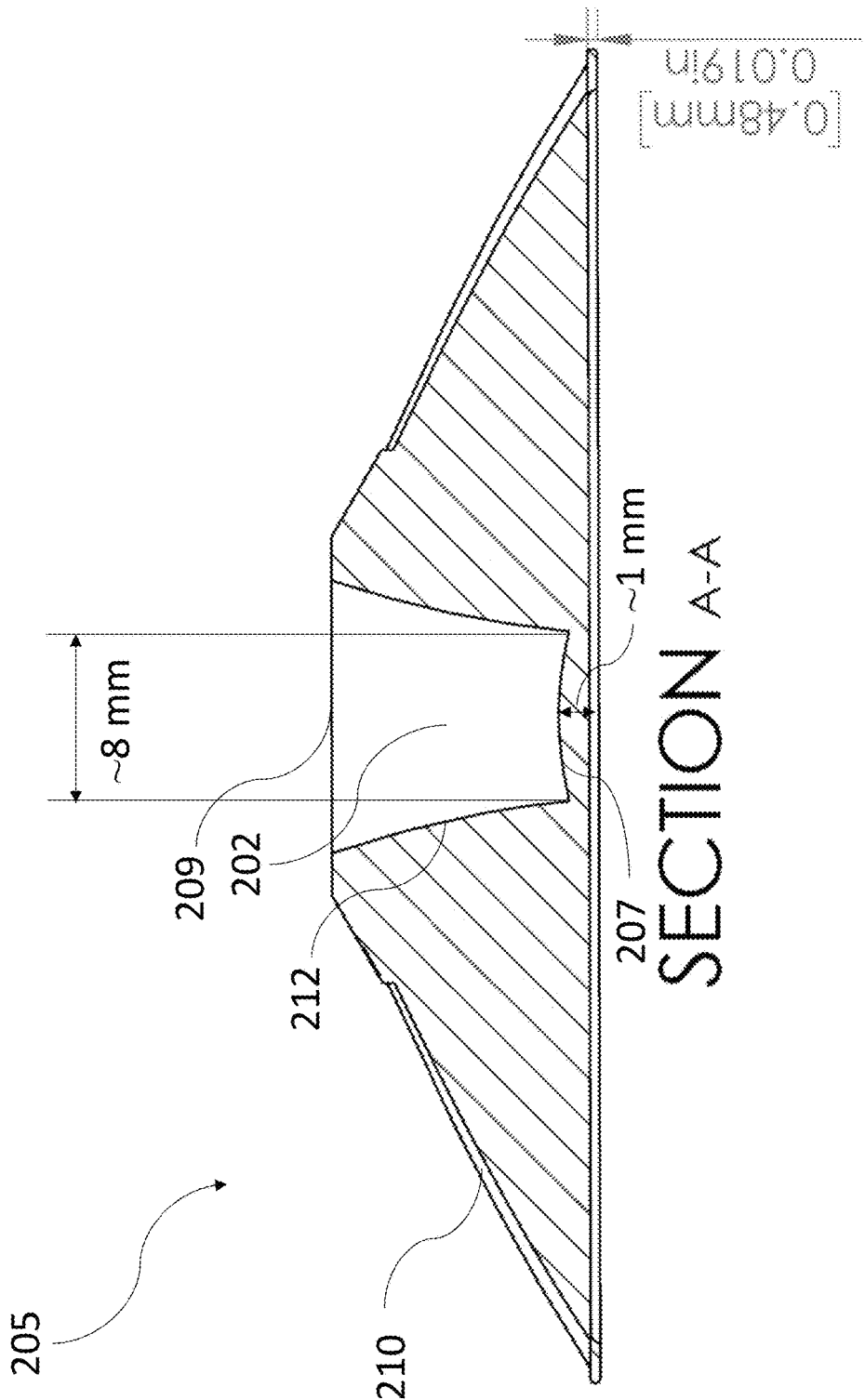
FIG. 4I is a front, cross-sectional view of the folded optic element of FIG. 4E along the cross-section labelled A-A.

In some implementations, the hollow core 202 may extend entirely through the folded optic element 205 such that there is no core output boundary 207, but, rather, an opening on the output surface 214 coincident with the hollow core 202. In this manner, parasitic reflections along the core output boundary 207 and/or the output surface 214 for light rays in the first light bundle may be substantially reduced. In some implementations, the core output boundary 207 may be positioned at a distance from the output surface 214 of the folded optic element 205, as shown in FIG. 4I. The distance may be adjusted based, in part, to improve ease of manufacturability (e.g., reducing the fragility of the output surface 214 to cracks and/or fracture). For instance, the distance may range from about 1 mm to about 2 mm. Additionally, by enclosing the hollow core 202, the hybrid optic 200 may also reduce exposure of the light source 104 to the ambient environment, thereby reducing degradation and increasing operating lifetime. In some instances, the core output boundary 207 may be substantially flat such that the plane of the core output boundary 207 is substantially parallel to the output surface 214, to reduce manufacturing complexity. In some instances, the core output boundary 207 may have a curvature (e.g., an aspheric profile or a spherical profile), as described above and shown in FIG. 4I, to increase the light coupling efficiency by refracting light rays from the first light ray bundle towards a more preferable angle relative to the output surface 214 (e.g., closer to normal incidence). The curvature may also help to improve the appearance of the light beam outputted by the hybrid optic 200 by providing a smoother spatial and angular intensity distribution.

In some implementations, coatings may be applied to various surfaces of the folded optic element 205. For example, anti-reflection (AR) coatings may be applied to the interior hollow core sidewall 212 and to portions of the output surface 214 to reduce unwanted reflections arising from the optical impedance mismatch between the refractive index of the folded optic element 205 and air, thereby increasing the light coupling efficiency. Such parasitic reflections may be especially apparent if the folded optic element 205 is formed form materials having a high refractive index compared to that of air, e.g., an index of about 1. The AR coatings may be one or more homogenous thin films having refractive indices that vary between the main body of the folded optic element 205 and air such that a gradient in the refractive index is formed. The gradient may be such that the films having the highest refractive index are disposed proximate to the main body of the folded optic element 205 and the films having the lowest refractive index are disposed proximate to the ambient air. The AR coating may also be comprised of a patterned structure, such as a moth's eye coating or an array of micro/nanocones, to reduce unwanted reflections over a broader range of incident angles. The patterned structure may have characteristic dimensions (e.g., pitch, element size) comparable or smaller than the wavelength of light. The patterned structure may also be formed directly onto the surface of the main body of the folded optic element 205 such that additional coatings are not necessary or deposited as a separate material and patterned.

In another example, coatings may be applied as a form of cladding. For instance, a coating may be disposed onto the output surface 214 to protect the output surface 214 from damage (e.g., scratches) and/or to reduce contamination (e.g., dust, dirt) of the output surface 214, which may cause unwanted outcoupling of light, e.g., light coupled at undesirable angles relative to the center axis of the hybrid optic 200. The cladding may be formed from a material having a refractive index preferably similar to air such that the critical angle for TIR at the output surface 214 is not substantially affected by the coating.

Coatings may be applied after fabrication of the main body of the folded optic element 205 using various deposition methods including, but not limited to thermal evaporation, e-beam evaporation, sputtering, dip coating, chemical vapor deposition, and any other method known to one of ordinary skill in the art. In some implementations, a coating may be formed by doping the surface of the main body such that a layer having a refractive index different from the main body of the folded optic element 205 is formed. For patterned structures, various patterning methods may be used including, but not limited to, photolithography, e-beam lithography, and nanoprinting, combined with various etching methods including, but not limited to, reactive ion etching, wet chemical etching, and ion milling.

The folded optic element 205 in the hybrid optic 200 may be formed from materials that are transparent to the wavelength(s) of light emitted by the light source 104. For example, the folded optic element 205 may be tailored for transmission in visible wavelengths, e.g., 400-700 nm, or near infrared wavelengths, e.g., 700 nm-2 µm. Additional considerations may also be made with respect to the refractive index of the material, which may affect the dimensionality of the hybrid optic 200. Generally, a material having a higher refractive index exhibits a smaller critical angle for TIR with respect to air, which may result in a thicker hybrid optic 200 with a larger hollow core 202 to accommodate a larger range of intermediate emission angles. Depending on the desired operating wavelength range and refractive index, various hard plastics, glasses, and ceramics may be used including, but not limited to as polycarbonate, acrylic polymer, cyclo olefin polymer (Zeonex), polystyrene, silicate-based glasses, calcium fluoride, magnesium fluoride, silicon, germanium, or zinc selenide. The refractive index of the material may also be further modified by doping or introducing porosity into the material.

Depending on the material used to form the folded optic element 205, several manufacturing methods may be used to fabricate the folded optic element 205 including, but not limited to, injection molding, milling, lapping, grinding, and any other method known to one of ordinary skill in the art. In some implementations, some of the surfaces of the folded optic element 205, e.g., the hollow core sidewall 212, the output surface 214, may be further polished to reduce the surface roughness, thereby improving the optical quality of the folded optic element 205, which may engender a higher light coupling efficiency, for instance, by reducing parasitic light scattering that causes a portion of the light to be trapped in the folded optic element 205. A lower surface roughness may also lead to a smoother spatial and angular intensity distribution by increasing the proportion of specularly reflected light, which the hybrid optic 200 is designed to manipulate, to the proportion of diffusely reflected light. Various polishing methods may be used depending on the material used to form the folded optic element 205 including, but not limited to, chemical mechanical polishing, abrasives, machining (e.g., diamond turning), and any other method known to one of ordinary skill in the art.

The reflector element 204 is primarily used to reflect light emitted at larger emission angles from the light source 104 such that light rays be directly radiated out of the hybrid optic 200, e.g., light ray 208, or indirectly radiated out of the hybrid optic 200, e.g., light ray 211, thereby increasing the light coupling efficiency. In some implementations, the reflector element 204 and the folded optic element 205 may be formed as a single component. In some implementations, the reflector element 204 may be a separate component mechanically and optically coupled to the folded optic element 205. The combination of the reflector element 204 and the folded optic element 205 thus forms the hybrid optic 200.

Figure 5A:
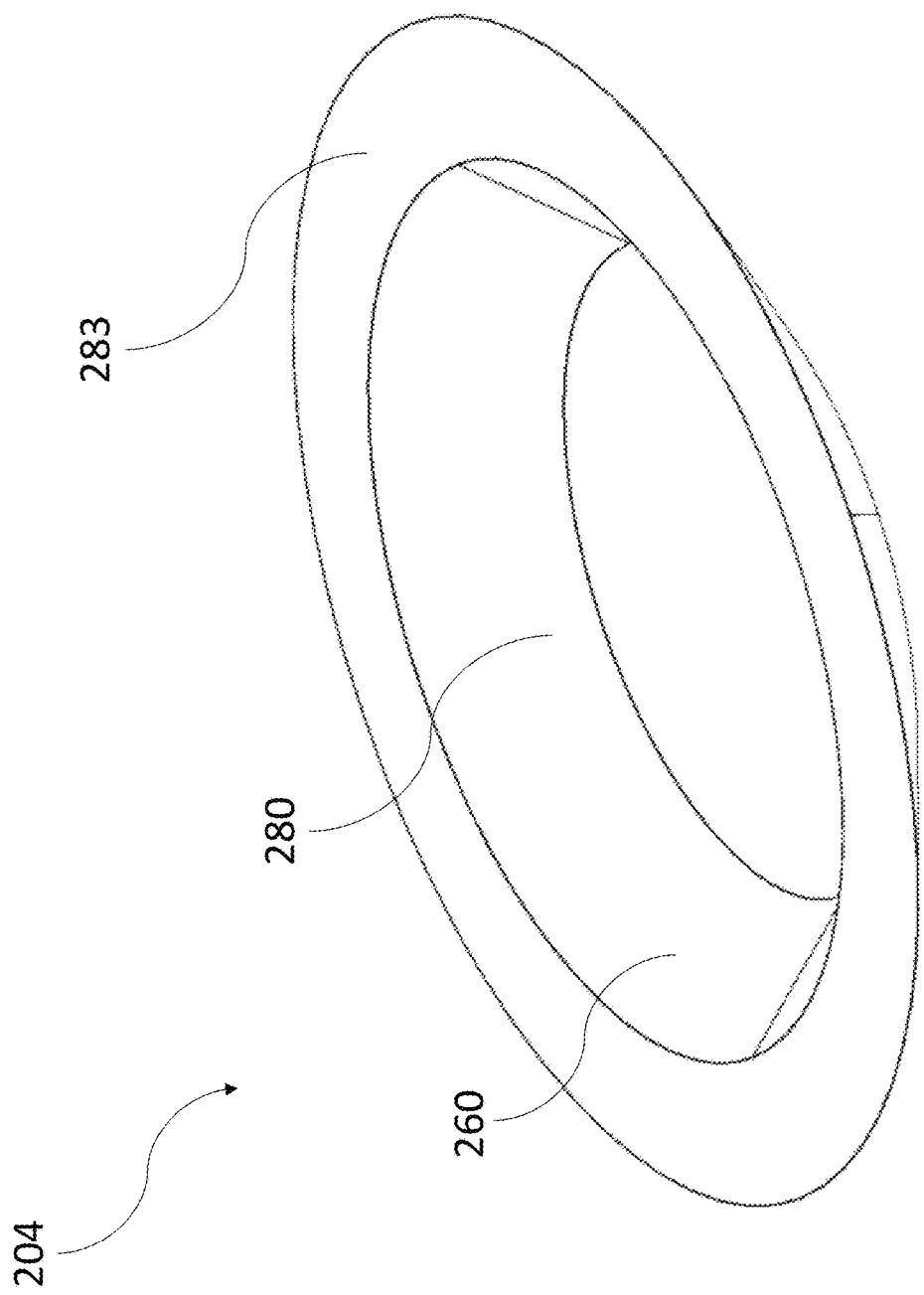
FIG. 5A is a top, perspective view of a reflector element, according to some implementations of the disclosure, in the hybrid optic apparatus of FIG. 4A.

FIGS. 5A-5F show various views of an exemplary reflector element 204 for implementations where the reflector element 204 is designed to be a separate component. FIG. 5A shows a top, perspective view of the reflector element 204. It should be appreciated that the top, bottom, front, rear, left, and right views of the reflector element 204 shown in FIGS. 5A-5F are intended to provide orientation and may not be representative of the orientation in which the reflector element 204 is disposed in a luminaire. As shown in FIG. 5A, the reflector element 204 may be an axisymmetric component with radial symmetry about an axis coincident with the optical axis, z, of the hybrid optic 200. Light from the light source 104 enters the reflector element 204 through an input opening 282 and exits through an output opening 280 into the hollow core 202 of the folded optic element 205. The reflector element 204 includes the reflective surface 260, shown as the interior surface of the reflector element 204 between the input opening 282 and the output opening 280. The reflective surface 260 may be tailored to be reflective, as discussed in more detail below.

Figure 5B:
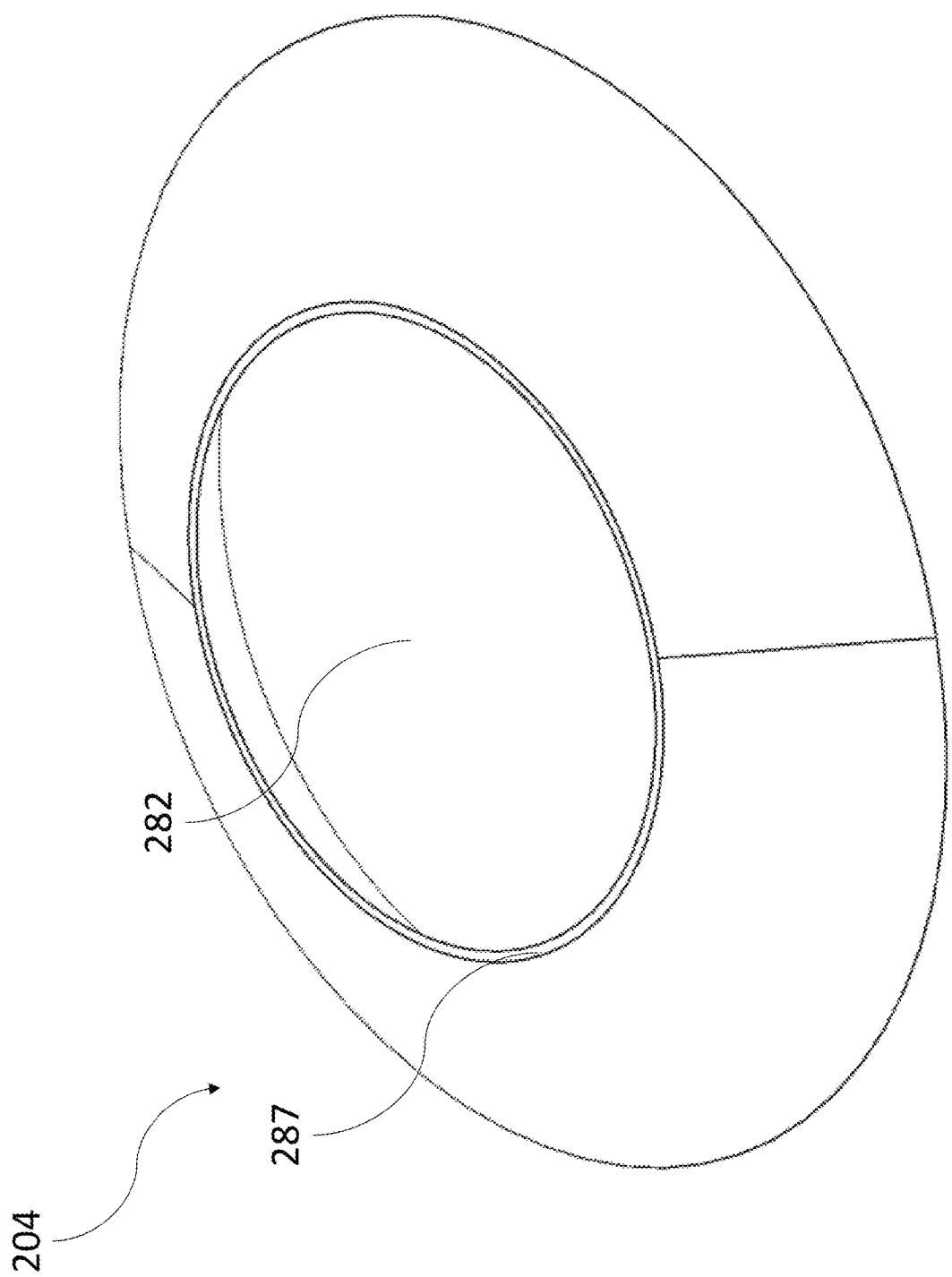
FIG. 5B is a bottom, perspective view of the reflector element of FIG. 5A.
Figure 5D:
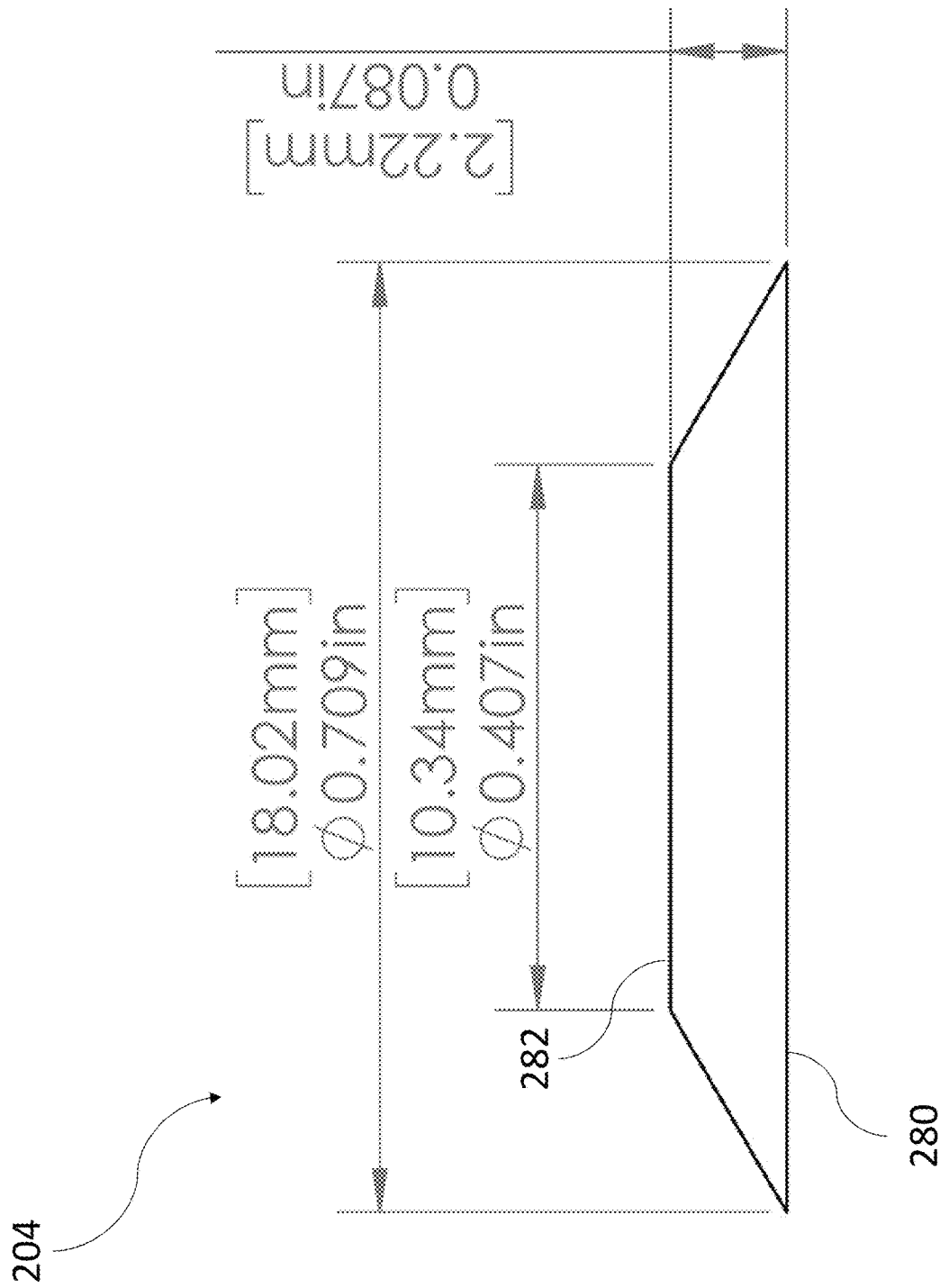
FIG. 5D is a front view of the reflector element of FIG. 5A.
Figure 5E:
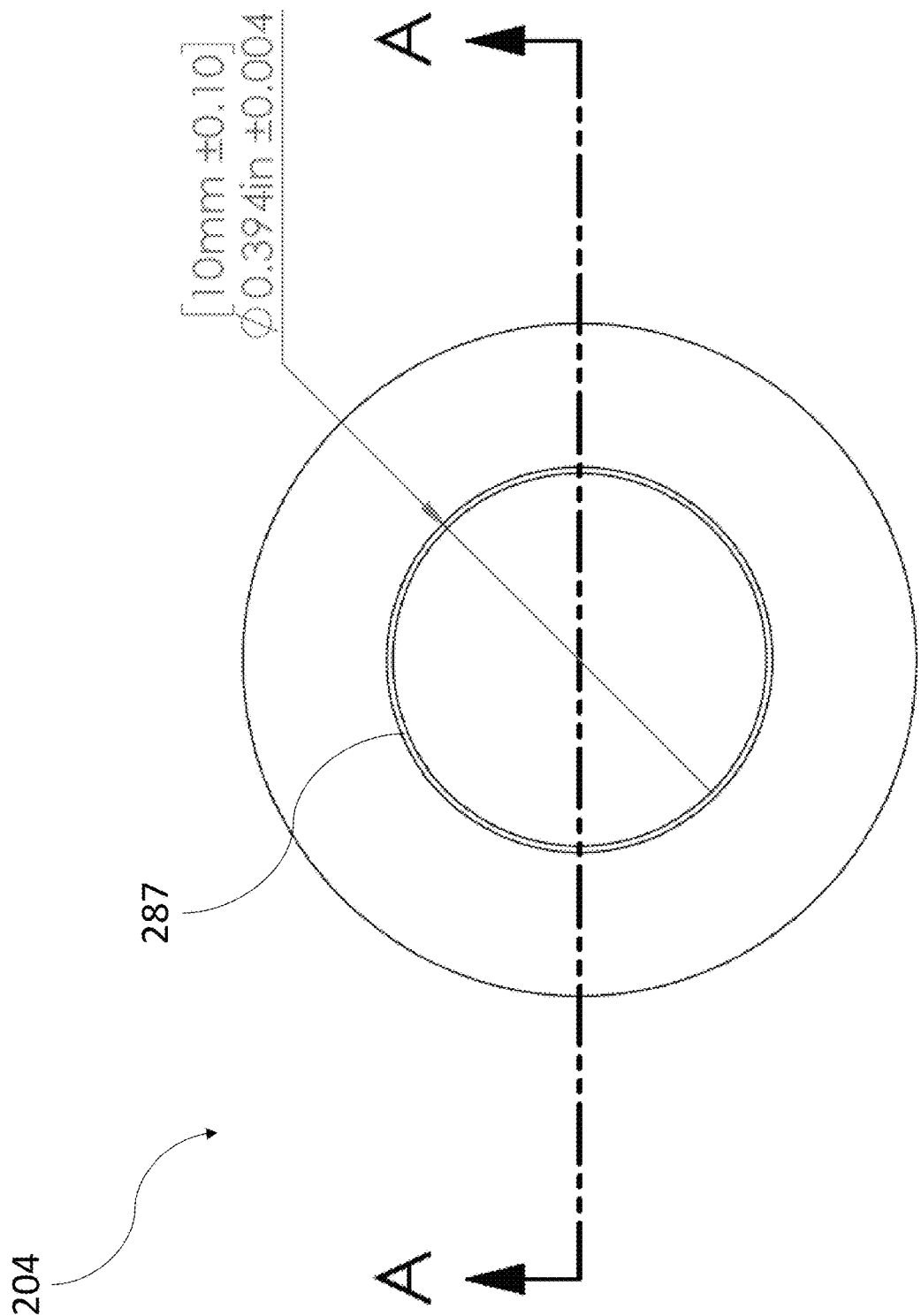
FIG. 5E is a bottom view of the reflector element of FIG. 5A.
Figure 5F:
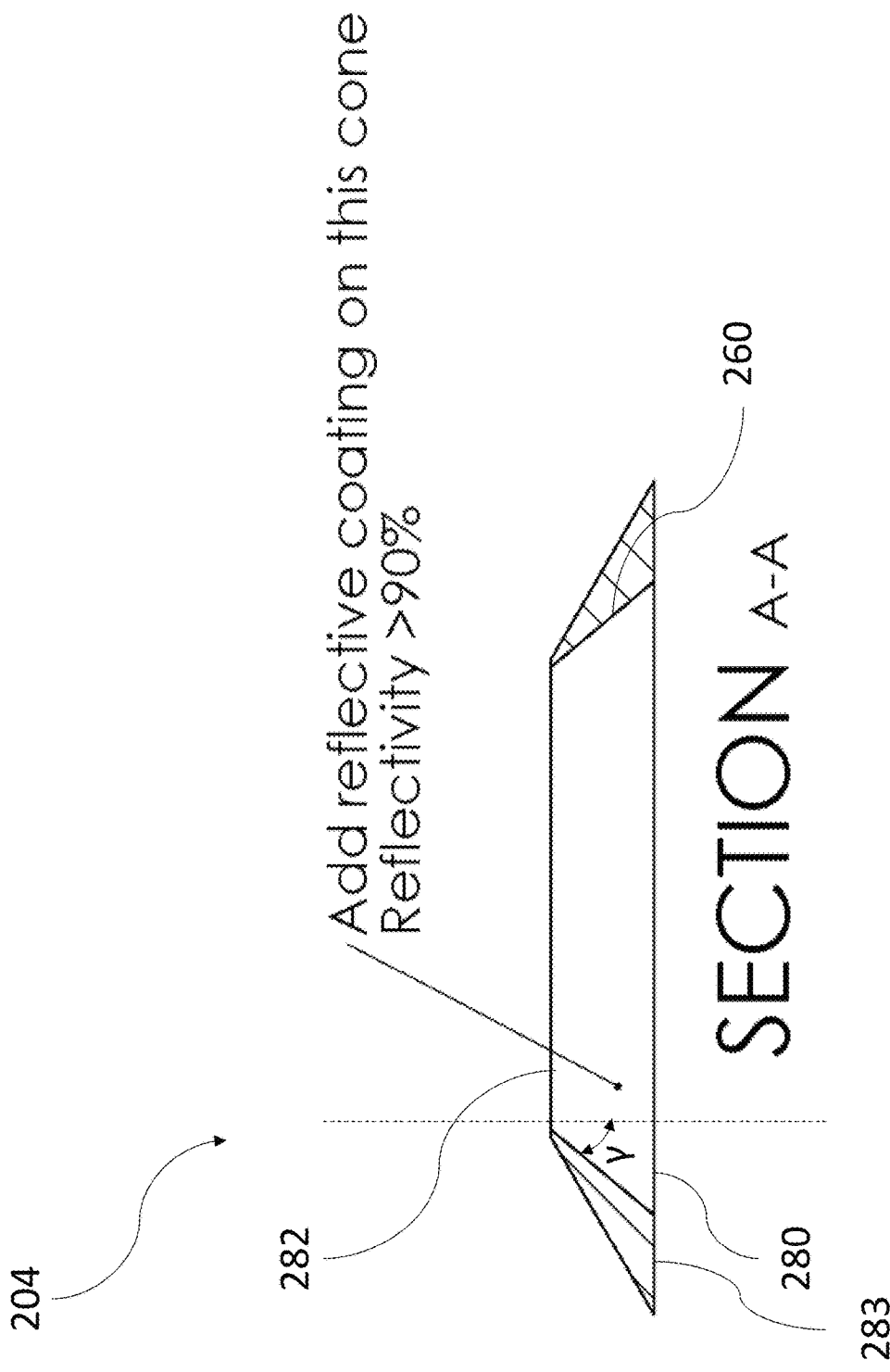
FIG. 5F is a front, cross-sectional view of the reflector element of FIG. 5E along the cross-section labelled A-A.

FIG. 5B shows a bottom, perspective view of the reflector element 204 detailing the input opening 282. FIG. 5C shows a top view of the reflector element 204 detailing exemplary dimensions of the output opening 280 and the flange 283. FIG. 5D shows a front view of the reflector element 204 showing that the exterior surface between the input opening 282 and the output opening 280 may also be truncated cone in some implementations. FIG. 5E shows a bottom view of the reflector element 204 detailing a bottom flange 287 that may be placed in contact with the light source 104 or disposed proximate from the light source 104 (e.g., to reduce excess heating of the reflector element 204. FIG. 5F shows a cross-sectional view along the cross-section labelled A-A in FIG. 5E. As shown, the reflective surface 260 may have a linear profile oriented at an angle, y, from the optical axis, z, of the hybrid optic 200. In this particular example of the reflector element 204, the angle γ is about 39.8 degrees.

Figure 6A:
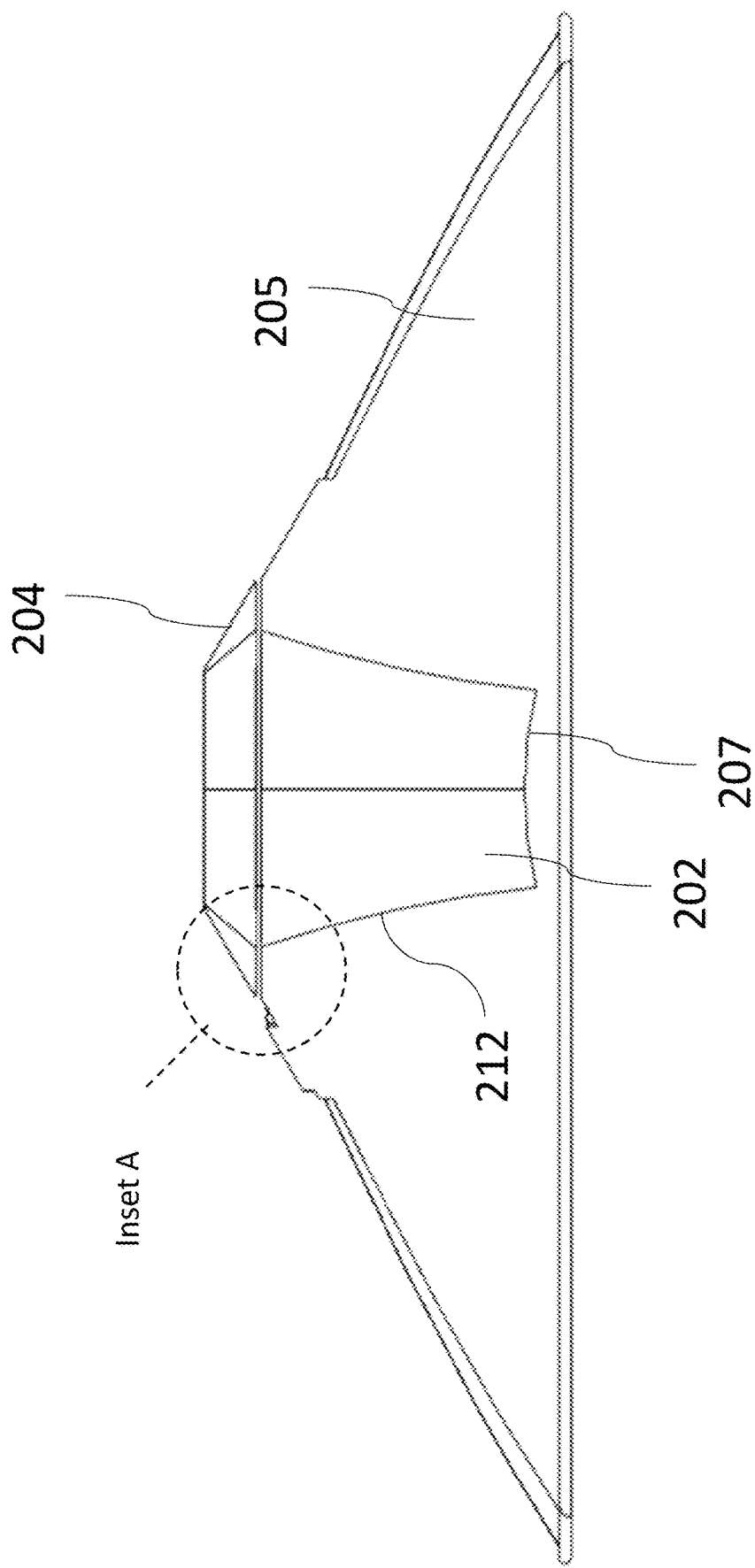
FIG. 6A is a front view of the hybrid optic apparatus of FIG. 4A.
Figure 6B:
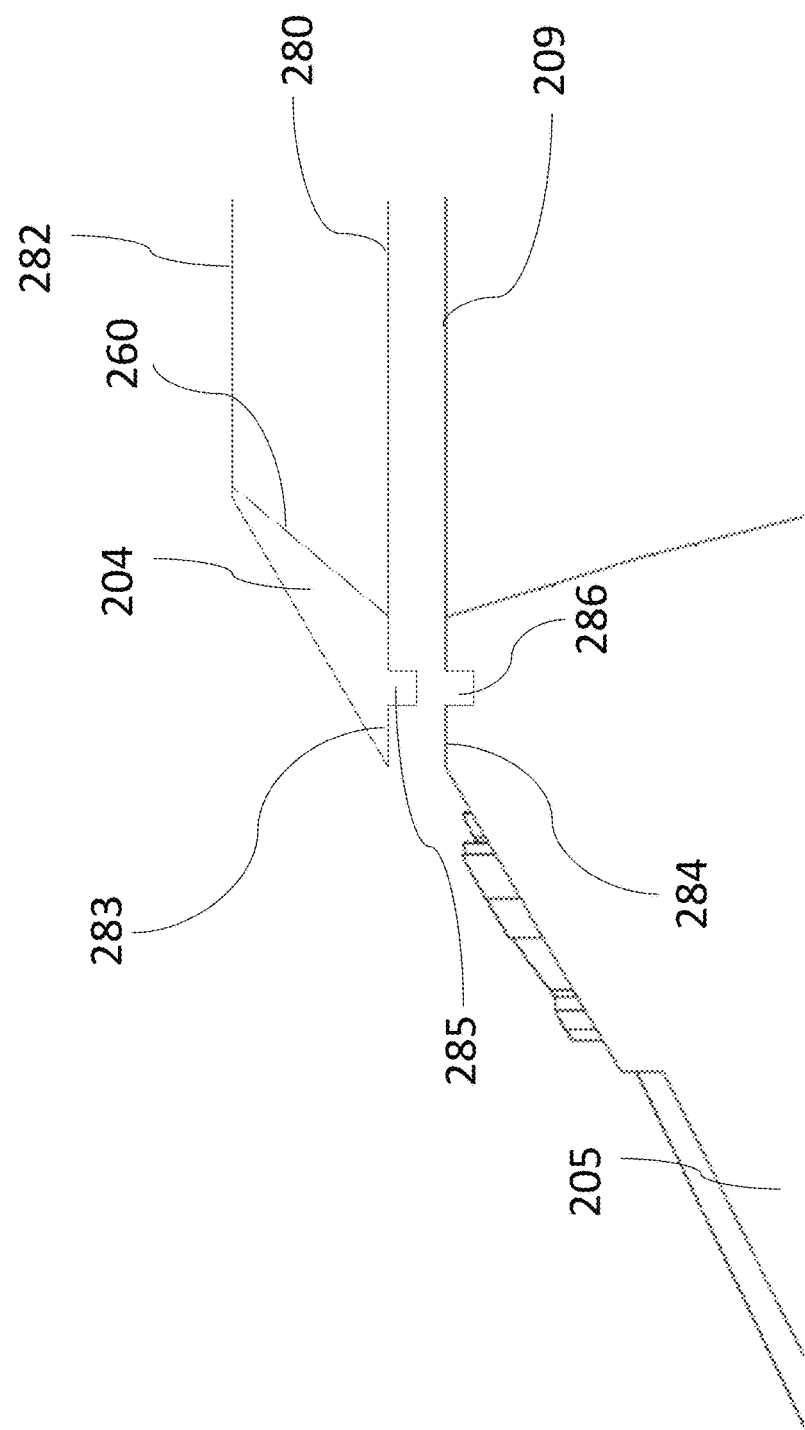
FIG. 6B is a magnified view of the hybrid optic apparatus of FIG. 6A, according to the inset labelled A.

In some implementations, the reflector element 204 may be designed to support operation at elevated temperatures (e.g., up to about 150° C.) to accommodate heating from the light source 104. The reflector element 204 may also include a top flange 283 that couples to a corresponding flange 284 of the folded optic element 205 at the core input opening 209. The flange 283 and 284 may be coupled together using various attachment methods including, but not limited to, ultrasonic welding, polymer adhesives, mechanical snap-in features, a ring to press and secure the lens onto the reflector, or any other methods known to one of ordinary skill in the art. In some implementations, the flange 283 may include a first coupling feature, such as a nipple 285 shown in FIGS. 6A and 6B, to facilitate alignment between the reflector element 204 and the folded optic element 205 and to increase the surface are available for bonding. The flange 284 may include a corresponding second coupling feature, such as a cavity 286, to mechanically register the nipple 285 as shown in FIG. 6B. In some implementations, the flanges 283 and 284 may be intentionally roughened so as to increase the surface area available for bonding. In some implementations, a plurality of nipples 285 and cavities 286 and/or corresponding grooves may be used to facilitate alignment and assembly of the reflector element 204 to the folded optic element 205.

The reflector element 204 may be formed from various metals including, but not limited to, aluminum, brass, and stainless steel. In other implementations, the reflector may be formed from non-reflective materials, such as polycarbonate, acrylic polymer, cyclo olefin polymer (Zeonex), polystyrene, and coated with a reflective material such as chromium, aluminum, silver, gold, or a dielectric Bragg mirror coating. Depending on the material used to form the reflector element 204, several manufacturing methods may be used to fabricate the reflector element 204 including injection molding, milling, polishing, lapping, grinding, or any other method known to one of ordinary skill in the art. A reflective coating may also be applied using any deposition method known in the art including thermal evaporation, e-beam evaporation, sputtering, dip coating, or chemical vapor deposition. Adhesion layers may be disposed between the reflective outer surface 210 and the coating to reduce delamination of the coating during operation and/or handling. For instance, adhesion layers formed of thin layers of chromium or titanium (less than 10 nm thick) may be used in implementations where the reflective coating is another metal, such as gold.

In some implementations, the reflector element 204 may be formed from the same material as the folded optic element 205 to facilitate ease of assembly. For example, materials having a substantially similar chemical composition may be more readily coupled together via ultrasonic welding. Furthermore, depending on the method used for manufacture, the reflective surface 260 of the reflector element 204 may be polished to improve the optical quality by reducing the surface roughness. Various polishing methods may be used depending on the material used to form the folded optic element 205 including, but not limited to, chemical mechanical polishing, abrasives, machining (e.g., diamond turning), and any other method known to one of ordinary skill in the art. In implementations where the folded optic element 205 and the reflector element 204 are manufactured as a single component, the reflective surface 260 of the reflector element 204 may still be coated with a reflective material using the aforementioned deposition methods in combination with a mask applied to the hollow core sidewall 212 and the core output boundary 207 to preserve transparency.

Figure 7:
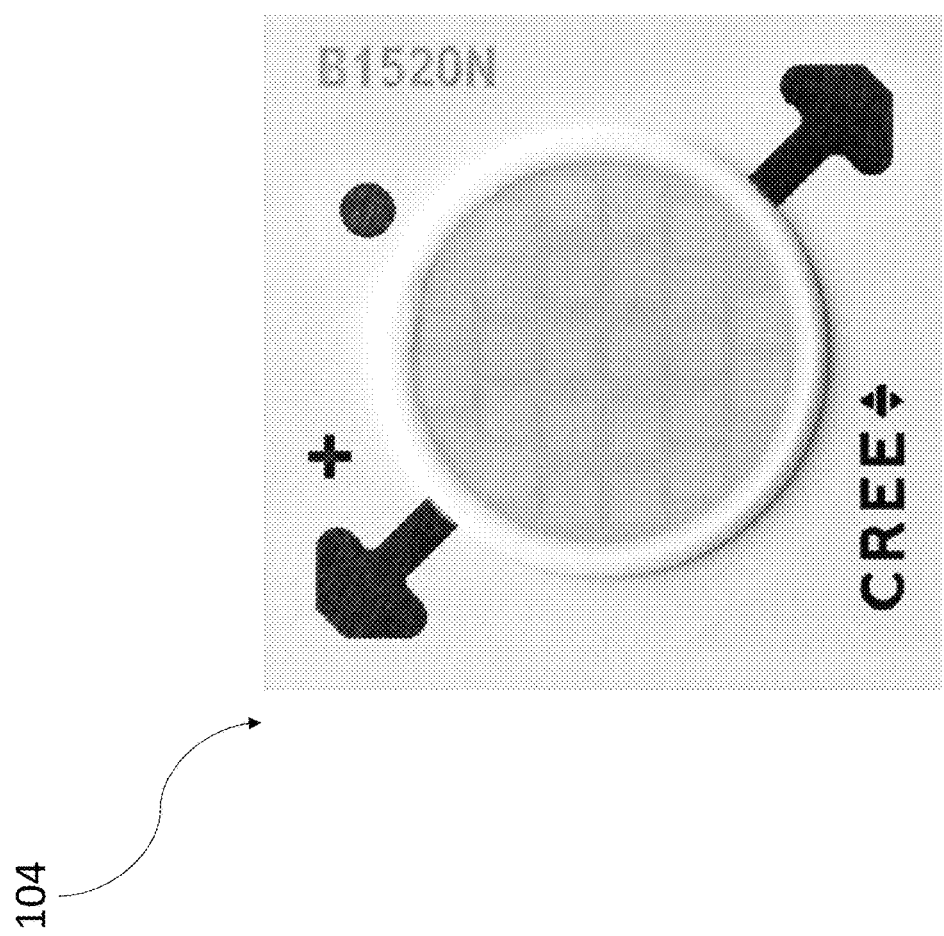
FIG. 7 is an image of an exemplary light source.

It should be appreciated that the hybrid optic 200 described in the present disclosure may be used with a variety of electrooptical light devices including, but not limited to, light emitting diodes (LEDs, such as an XLamp LED from Cree), organic light-emitting diode (OLEDs), or polymer light-emitting diode (PLEDs). The light source 104 may include one or more LED's that each emit light. For instance, FIG. 7 shows an exemplary light source 104 wherein a plurality of LED's are disposed within a circular area of the light source 104. The hybrid optic 200, as described above, may be designed and tailored to a particular light source 104. The input opening 282 of the reflector element 204 may also be dimensioned to be sufficiently large such that light emitted by the light source 104 substantially enters an interior cavity defined by the reflective surface 260 of the reflector element 204 and the hollow core 202 of the folded optic element 205.

CONCLUSION

While various inventive implementations have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive implementations described herein. More generally, those skilled in the art will readily appreciate that all parameters and configurations described herein are meant to be exemplary inventive features and that other equivalents to the specific inventive implementations described herein may be realized. It is, therefore, to be understood that the foregoing implementations are presented by way of example and that, within the scope of the appended claims and equivalents thereto, inventive implementations may be practiced otherwise than as specifically described and claimed. Inventive implementations of the present disclosure are directed to each individual feature, system, article, and/or method described herein. In addition, any combination of two or more such features, systems, articles, and/or methods, if such features, systems, articles, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, implementations may be constructed in which acts are performed in an order different than illustrated, which may include performing some acts simultaneously, even though shown as sequential acts in illustrative implementations.

All publications, patent applications, patents, and other references mentioned herein are incorporated by reference in their entirety.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one implementation, to A only (optionally including elements other than B); in another implementation, to B only (optionally including elements other than A); in yet another implementation, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one implementation, to at least one, optionally including more than one, A, with no B present (and optionally including elements other than B); in another implementation, to at least one, optionally including more than one, B, with no A present (and optionally including elements other than A); in yet another implementation, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A hybrid lens to redirect light emitted by a light source during operation of the light source, the hybrid lens comprising:
   a folded optic element defining an optical axis of the hybrid lens, the folded optic element comprising:
      an output surface from which the light exits the hybrid lens, the output surface reflecting at least a portion of the light within the folded optic element prior to the portion of the light exiting the hybrid lens;
      a first flange oriented parallel with the output surface;
      an outer reflective surface comprising a plurality of triangular-shaped grooves forming corresponding total internal reflection (TIR) prisms, the plurality of triangular-shaped grooves being radially oriented with respect to the optical axis and separated from the first flange; and
      a hollow core comprising:
         a sidewall sharing an edge with the first flange;
         a core output boundary disposed proximate to and in concentric alignment with the output surface; and
         a core input opening, defined by the edge, through which the light enters the folded optic element; and
   a reflector, optically coupled to the core input opening and disposed outside the hollow core, to receive the light emitted by the light source, reflect a first portion of the light, and directly transmit a second portion of the light into the hollow core without reflection by the reflector.

2. The hybrid lens of claim 1, wherein during operation of the light source:
   a first light ray bundle passes first into the reflector and then into the hollow core without reflection by the reflector, and is thereafter transmitted through the core output boundary of the hollow core;
   a second light ray bundle passes first into the reflector and then into the hollow core without reflection by the reflector, is thereafter refracted at the sidewall of the hollow core, is thereafter reflected at the lens output surface of the folded optic element, is thereafter reflected at the outer reflective surface of the folded optic element, and is thereafter transmitted through the lens output surface of the folded optic element;
   a third light ray bundle passes first into the reflector and is reflected by the reflector into the hollow core and is thereafter transmitted through the core output boundary of the hollow core; and
   a fourth light ray bundle passes first into the reflector and is reflected by the reflector into the hollow core, is thereafter refracted at the sidewall of the hollow core, is thereafter reflected at the lens output surface of the folded optic element, is thereafter reflected at the outer reflective surface of the folded optic element and is thereafter transmitted through the lens output surface of the folded optic element.

3. The hybrid lens of claim 1, wherein the folded optic element further comprises:
   a lip, disposed along the periphery of the output surface such that the plurality of triangular-shaped grooves are separated from the output surface, the lip comprising a surface offset from the output surface.

4. The hybrid lens of claim 1, wherein the output surface is a substantially flat surface intersecting the optical axis.

5. The hybrid lens of claim 1, wherein:
   the first flange of the folded optic element comprises a cavity; and
   the reflector comprises:
      a second flange, abutting the first flange, comprising a nipple inserted into the cavity of the first flange.

6. The hybrid lens of claim 1, wherein the outer reflective surface is defined by a curve having an aspheric profile with a relation:

$$z = \frac{cr^2}{1 + \sqrt{1 - (1+k)c^2 r^2}} + \alpha_1 r^2 + \alpha_2 r^4 + \alpha_3 r^6 + \alpha_4 r^8$$

wherein z is a value along a coordinate axis defined by the optical axis of the folded optic element, and z given by the relation is a displacement component along the coordinate axis, from a vertex of the aspheric profile, at a corresponding distance r from the coordinate axis at which a point on the outer reflective surface lies, and a1, a2, a3, a4 are coefficients where at least one of a2, a3, or a4 are non-zero.

7. The hybrid lens of claim 1, wherein the sidewall is defined by a curve having an aspheric profile with a relation:

$$z' = \frac{c' r'^2}{1 + \sqrt{1 - (1+k') c'^2 r'^2}} + \alpha'_4 r'^4 + \alpha'_6 r'^6$$

wherein z' is a value along a coordinate axis perpendicular to the optical axis of the folded optic element, and z' given by the relation is a displacement component along the coordinate axis, from a vertex of the aspheric profile, at a corresponding distance r' from the second coordinate axis at which a point on the sidewall lies, and a'$_4$ and a'$_6$ are coefficients where at least one of a'$_4$ or a'$_6$ are non-zero.

8. An optical apparatus comprising:
   the hybrid lens of claim 1; and
   the light source, optically coupled to the reflector of the hybrid lens and disposed outside the hollow core, to emit the light that is thereafter redirected by the hybrid lens.

9. A hybrid lens to redirect light emitted by a light source during operation of the light source, the hybrid lens comprising:
   a folded optic element comprising:
      an outer reflective surface;
      an output surface from which the light exits the hybrid lens, the output surface reflecting at least a portion of the light within the folded optic element prior to the portion of the light exiting the hybrid lens; and
      a hollow core comprising:
         a sidewall;
         a core output boundary disposed proximate to the output surface; and
         a core input opening through which the light enters the folded optic element; and
   a reflector optically coupled to the core input opening and disposed outside the hollow core, the reflector comprising:
      a reflector input opening to receive the light;
      a reflective sidewall to reflect a first portion of the received light, the reflective sidewall defining a hollow interior portion of the reflector; and a reflector output opening, aligned with and touching the core input opening, through which a second portion of the received light is directly transmitted into the hollow core from the hollow interior portion without reflection by the reflective sidewall, the reflector output opening being substantially similar in shape and size with the core input opening.

10. The hybrid lens of claim 9, wherein during operation of the light source:
a first light ray bundle passes first into the reflector and then into the hollow core without reflection by the reflector, and is thereafter transmitted through the core output boundary of the hollow core;
a second light ray bundle passes first into the reflector and then into the hollow core without reflection by the reflector, is thereafter refracted at the sidewall of the hollow core, is thereafter reflected at the lens output surface of the folded optic element, is thereafter reflected at the outer reflective surface of the folded optic element, and is thereafter transmitted through the lens output surface of the folded optic element;
a third light ray bundle passes first into the reflector and is reflected by the reflector into the hollow core and is thereafter transmitted through the core output boundary of the hollow core; and
a fourth light ray bundle passes first into the reflector and is reflected by the reflector into the hollow core, is thereafter refracted at the sidewall of the hollow core, is thereafter reflected at the lens output surface of the folded optic element, is thereafter reflected at the outer reflective surface of the folded optic element and is thereafter transmitted through the lens output surface of the folded optic element.

11. The hybrid lens of claim 9, wherein an angle of the reflective sidewall of the hollow interior portion of the reflector, relative to a normal to an emission surface of the light source when the hybrid lens is coupled to the light source, is approximately 40 degrees.

12. The hybrid lens of claim 9, wherein the reflector is formed from a polymer.

13. The hybrid lens of claim 11, wherein the reflector is coated with a metal.

14. The hybrid lens of claim 9, wherein:
the folded optic element comprises:
a first flange comprising a cavity; and
the reflector comprises:
a second flange, abutting the first flange, comprising a nipple inserted into the cavity of the first flange.

15. The hybrid lens of claim 9, wherein the first portion of the received light reflected by the reflective sidewall is reflected once before passing through the reflector output opening and entering into the hollow core.

16. An optical apparatus comprising:
the hybrid lens of claim 9; and
the light source, optically coupled to the reflector of the hybrid lens and disposed outside the hollow core, to emit the light that is thereafter redirected by the hybrid lens.

17. A hybrid lens to redirect light emitted by a light source during operation of the light source, the hybrid lens comprising:
a folded optic element defining an optical axis of the hybrid lens, the folded optic element comprising:
an outer reflective surface comprising a plurality of triangular-shaped grooves forming corresponding total internal reflection (TIR) prisms, the plurality of triangular-shaped grooves being radially oriented with respect to the optical axis;
an output surface from which the light exits the hybrid lens, the output surface reflecting at least a portion of the light within the folded optic element prior to the portion of the light exiting the hybrid lens, the output surface being a substantially flat surface intersecting the optical axis;
a lip, disposed along the periphery of the output surface such that the plurality of triangular-shaped grooves of the outer reflective surface are separated from the output surface, the lip comprising a surface offset from the output surface;
a first flange oriented parallel with the output surface; and
a hollow core comprising:
a sidewall sharing an edge with the first flange;
a core output boundary disposed proximate to and in concentric alignment with the output surface; and
a core input opening, defined by the edge, through which the light enters the folded optic element.

18. The hybrid lens of claim 17, further comprising:
a reflector, optically coupled to the core input opening and disposed outside the hollow core, to receive the light emitted by the light source, reflect a first portion of the light, and directly transmit a second portion of the light into the hollow core without reflection by the reflector.

19. The hybrid lens of claim 18, wherein the reflector comprises:
a reflector input opening to receive the light;
a reflective sidewall to reflect the first portion of the light, the reflective sidewall defining a hollow interior portion; and
a reflector output opening, aligned with the core input opening, through which the second portion of the light is directly transmitted into the hollow core from the hollow interior portion without reflection by the reflective sidewall.

20. The hybrid lens of claim 18, wherein:
the first flange of the folded optic element comprises a cavity; and
the reflector comprises:
a second flange, abutting the first flange, comprising a nipple inserted into the cavity of the first flange.

21. The hybrid lens of claim 17, wherein the hybrid lens substantially collimates the light exiting the hybrid lens from the output surface.

22. The hybrid lens of claim 17, wherein the plurality of triangular-shaped grooves of the outer reflective surface does not touch the first flange.

23. The hybrid lens of claim 17, wherein the outer reflective surface is defined by a curve having an aspheric profile with a relation:

$$z = \frac{cr^2}{1 + \sqrt{1 - (1+k)c^2 r^2}} + \alpha_1 r^2 + \alpha_2 r^4 + \alpha_3 r^6 + \alpha_4 r^8$$

wherein z is a value along a coordinate axis defined by the optical axis of the folded optic element, and z given by the relation is a displacement component along the coordinate axis, from a vertex of the aspheric profile, at a corresponding distance r from the coordinate axis at which a point on the outer reflective surface lies, and a1, a2, a3, a4 are coefficients where at least one of a2, a3, or a4 are non-zero.

24. The hybrid lens of claim 17, wherein the sidewall is defined by a curve having an aspheric profile with a relation:

$$z' = \frac{c'r'^2}{1+\sqrt{1-(1+k')c'^2 r'^2}} + a'_4 r'^4 + a'_6 r'^6$$

wherein z' is a value along a coordinate axis perpendicular to the optical axis of the folded optic element, and z' given by the relation is a displacement component along the coordinate axis, from a vertex of the aspheric profile, at a corresponding distance r' from the second coordinate axis at which a point on the sidewall lies, and $a'^4$ and $a'_6$ are coefficients where at least one of $a'_4$ or $a'_6$ are non-zero.

25. An optical apparatus comprising:
the hybrid lens of claim 17; and
the light source, optically coupled to the hollow core of the folded optic element of the hybrid lens and disposed outside the hollow core, to emit the light that is thereafter redirected by the hybrid lens.

26. A hybrid lens to redirect light emitted by a light source during operation of the light source, the hybrid lens comprising:
a folded optic element defining an optical axis of the hybrid lens, the folded optic element comprising:
an outer reflective surface comprising a first curved profile and a plurality of triangular-shaped grooves forming corresponding total internal reflection (TIR) prisms, the plurality of triangular-shaped grooves being radially oriented with respect to the optical axis;
an output surface from which the light exits the hybrid lens, the output surface reflecting at least a portion of the light within the folded optic element prior to the portion of the light exiting the hybrid lens, the output surface being a substantially flat surface intersecting the optical axis;
a lip, disposed along the periphery of the output surface such that the plurality of triangular-shaped grooves of the outer reflective surface are separated from the output surface, the lip comprising a surface offset from the output surface;
a first flange, oriented parallel with the output surface; and
a hollow core comprising:
a sidewall sharing an edge with the first flange and comprising a second curved profile;
a core output boundary disposed proximate to and in concentric alignment with the output surface; and
a core input opening, defined by the edge, through which the light enters the hollow core; and
a reflector, optically coupled to the core input opening and disposed outside the hollow core, the reflector comprising:
a reflector input opening to receive the light;
a reflective sidewall to reflect a first portion of the received light, the reflective sidewall defining a hollow interior portion;
a reflector output opening, aligned with the core input opening, through which a second portion of the received light is directly transmitted into the hollow core from the hollow interior portion without reflection by the reflective sidewall, the reflector output opening being substantially similar in shape and size with the core input opening; and
a second flange, abutting the first flange, comprising a nipple inserted into the cavity of the first flange,
wherein:
the first curved profile of the outer reflective surface is a first aspheric profile defined by a first reflation:

$$z = \frac{cr^2}{1+\sqrt{1-(1+k)c^2 r^2}} + a_1 r^2 + a_2 r^4 + a_3 r^6 + a_4 r^8$$

wherein z is a value along a first coordinate axis defined by the optical axis of the folded optic element, and z given by the first relation is a first displacement component along the first coordinate axis, from a vertex of the first aspheric profile, at a corresponding distance r from the first coordinate axis at which a point on the outer reflective surface lies, and a1, a2, a3, a4 are coefficients where at least one of a2, a3, or a4 are non-zero;
the second curved profile of the sidewall is a second aspheric profile defined by a second relation:

$$z' = \frac{c'r'^2}{1+\sqrt{1-(1+k')c'^2 r'^2}} + a'_4 r'^4 + a'_6 r'^6$$

wherein z' is a value along a second coordinate axis perpendicular to the optical axis of the folded optic element, and z' given by the second relation is a second displacement component along the second coordinate axis, from a vertex of the second aspheric profile, at a corresponding distance r' from the second coordinate axis at which a point on the sidewall lies, and
$a'_4$ and $a'_6$ are coefficients where at least one of $a'_4$ or $a'_6$ are non-zero; and
the hollow core is defined in the folded optic element by rotating a portion of the second aspheric profile around the optical axis at a predetermined offset distance between the vertex of the second aspheric profile and the optical axis of the folded optic element.

27. The hybrid lens of claim 26, wherein during operation of the light source:
a first light ray bundle passes first into the reflector and then into the hollow core without reflection by the reflector, and is thereafter transmitted through the core output boundary of the hollow core;
a second light ray bundle passes first into the reflector and then into the hollow core without reflection by the reflector, is thereafter refracted at the sidewall of the hollow core, is thereafter reflected at the lens output surface of the folded optic element, is thereafter reflected at the outer reflective surface of the folded optic element, and is thereafter transmitted through the lens output surface of the folded optic element;
a third light ray bundle passes first into the reflector and is reflected by the reflector into the hollow core and is thereafter transmitted through the core output boundary of the hollow core; and
a fourth light ray bundle passes first into the reflector and is reflected by the reflector into the hollow core, is thereafter refracted at the sidewall of the hollow core, is thereafter reflected at the lens output surface of the folded optic element, is thereafter reflected at the outer reflective surface of the folded optic element and is thereafter transmitted through the lens output surface of the folded optic element.

28. The hybrid lens of claim 26, wherein the hybrid lens substantially collimates the light exiting the output surface.

29. The hybrid lens of claim 26, wherein the first portion of the received light reflected by the reflective sidewall is reflected once before passing through the reflector output opening and entering into the hollow core.

30. An optical apparatus comprising:
   the hybrid lens of claim 26; and
   the light source, optically coupled to the reflector of the hybrid lens and disposed outside the hollow core, to emit the light that is thereafter redirected by the hybrid lens.

* * * * *